(12) United States Patent
Morishita et al.

(10) Patent No.: US 12,334,297 B2
(45) Date of Patent: Jun. 17, 2025

(54) ELECTRON GUN AND ELECTRON BEAM APPLICATION DEVICE

(71) Applicant: Hitachi High-Tech Corporation, Tokyo (JP)

(72) Inventors: Hideo Morishita, Tokyo (JP); Takashi Ohshima, Tokyo (JP); Yoichi Ose, Tokyo (JP); Toshihide Agemura, Tokyo (JP); Makoto Kuwahara, Nagoya (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 189 days.

(21) Appl. No.: 18/036,217

(22) PCT Filed: Dec. 22, 2020

(86) PCT No.: PCT/JP2020/047913
§ 371 (c)(1),
(2) Date: May 10, 2023

(87) PCT Pub. No.: WO2022/137332
PCT Pub. Date: Jun. 30, 2022

(65) Prior Publication Data
US 2023/0402246 A1    Dec. 14, 2023

(51) Int. Cl.
*H01J 37/073*     (2006.01)
*H01J 3/02*       (2006.01)

(52) U.S. Cl.
CPC .......... *H01J 37/073* (2013.01); *H01J 3/021* (2013.01); *H01J 2237/06333* (2013.01)

(58) Field of Classification Search
CPC ............. H01J 37/073; H01J 3/021; H01J 2237/06333; H01J 2237/06375; H01J 2237/2626; H01J 1/34; H01J 3/02
See application file for complete search history.

(56) References Cited

U.S. PATENT DOCUMENTS

| 5,684,360 A | 11/1997 | Baum et al. |
| 6,051,917 A | 4/2000 | Nakasuji |

(Continued)

FOREIGN PATENT DOCUMENTS

| CN | 108428610 A | 8/2018 |
| EP | 4138114 A1 | 3/2021 |

(Continued)

OTHER PUBLICATIONS

Makoto Kuwahara, et al., "Coherence of a spin-polarized electron beam emitted from a semiconductor photocathode in a transmission electron microscope", Applied Physics Letters, 105, 193101 (2014); https://doi.org/10.1063/1.4901745.

(Continued)

*Primary Examiner* — David E Smith
*Assistant Examiner* — Christopher J Gassen
(74) *Attorney, Agent, or Firm* — MATTINGLY & MALUR, PC

(57) ABSTRACT

The apparatus includes: a photocathode including a substrate and a photoelectric film formed on the substrate; a light source configured to emit a pulsed excitation light; a condenser lens facing the substrate of the photocathode and configured to condense the pulsed excitation light toward the photocathode; a first anode electrode and a second anode electrode facing the photoelectric film of the photocathode; a first power supply configured to apply a first control voltage between the first anode electrode and the second anode electrode; and a second power supply configured to apply an acceleration voltage between the photocathode and the second anode electrode. The first anode electrode is disposed between the photocathode and the second anode electrode. A surface of the first anode electrode facing the second anode electrode has a recessed shape, and a surface (Continued)

of the second anode electrode facing the first anode electrode has a protruding shape.

14 Claims, 18 Drawing Sheets

(56) References Cited

U.S. PATENT DOCUMENTS

| 2010/0320942 | A1* | 12/2010 | Hayn | H01J 37/063 |
| | | | | 315/379 |
| 2014/0197336 | A1 | 7/2014 | Watanabe et al. | |
| 2021/0043411 | A1 | 2/2021 | Kuwahara et al. | |
| 2022/0199350 | A1 | 6/2022 | Nishitani et al. | |

FOREIGN PATENT DOCUMENTS

| JP | 10-112274 | A | 4/1998 |
| JP | 11-509360 | U | 8/1999 |
| JP | 2001-143648 | A | 5/2001 |
| JP | 2007-258119 | A | 10/2007 |
| JP | 2007-531876 | A | 11/2007 |
| JP | 2013-045525 | A | 3/2013 |
| JP | 6722958 | B1 | 7/2020 |
| JP | 6762635 | B1 | 9/2020 |
| WO | 2005/098895 | A2 | 10/2005 |
| WO | 2019/151025 | A1 | 8/2019 |

OTHER PUBLICATIONS

International Search Report of PCT/JP2020/047913 dated Mar. 16, 2021.

* cited by examiner

[FIG. 1]
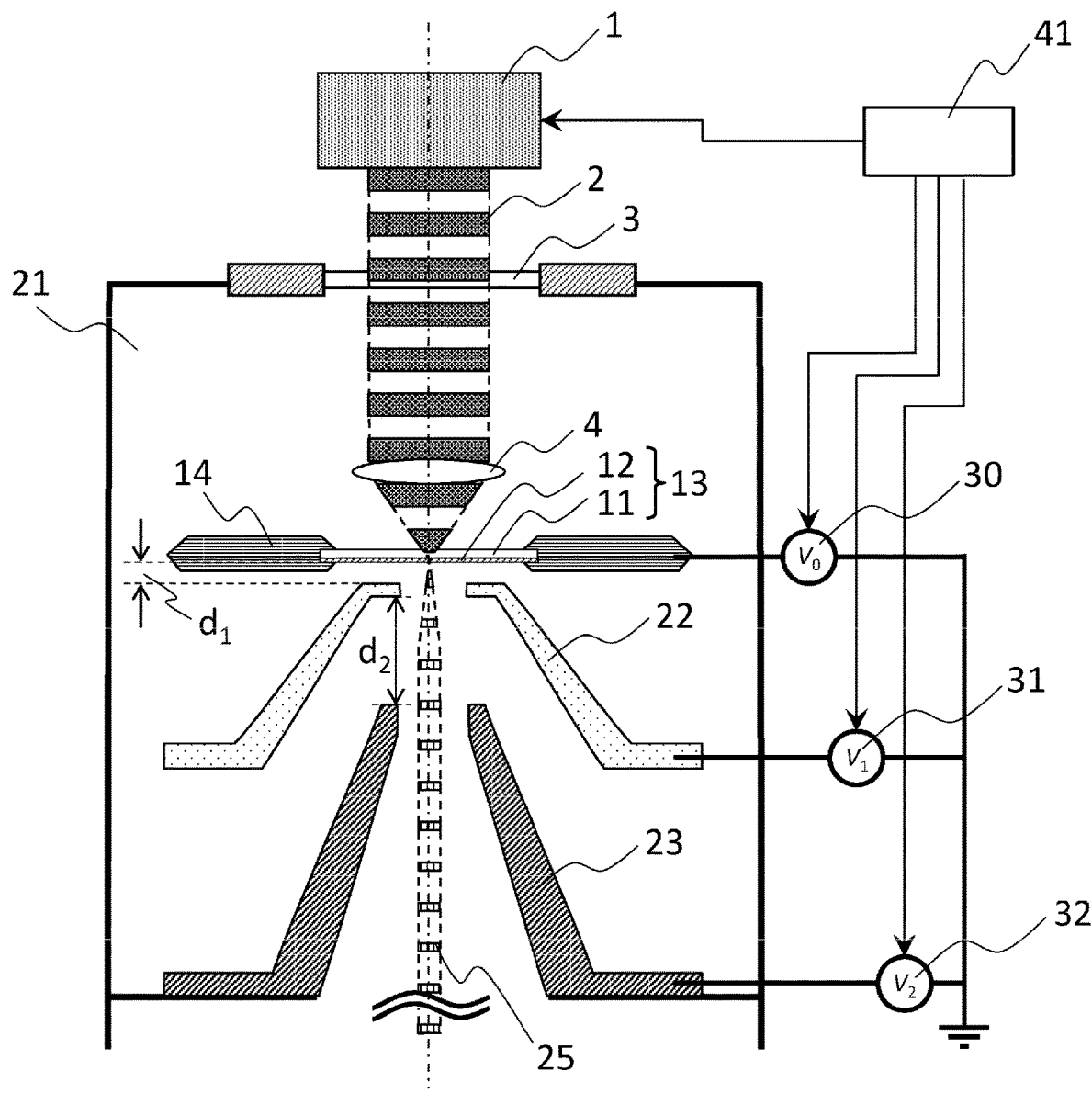

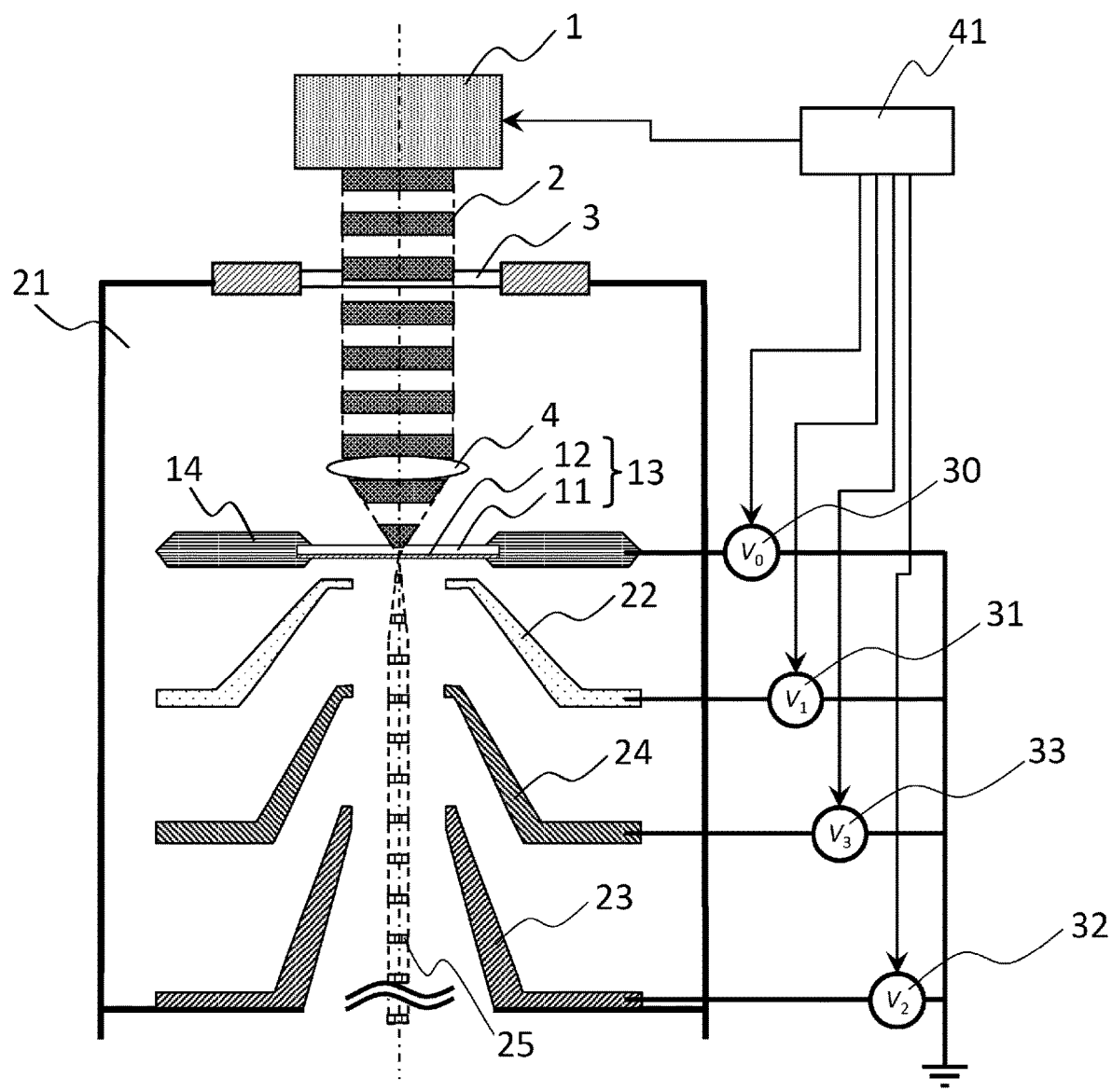
[FIG. 2]

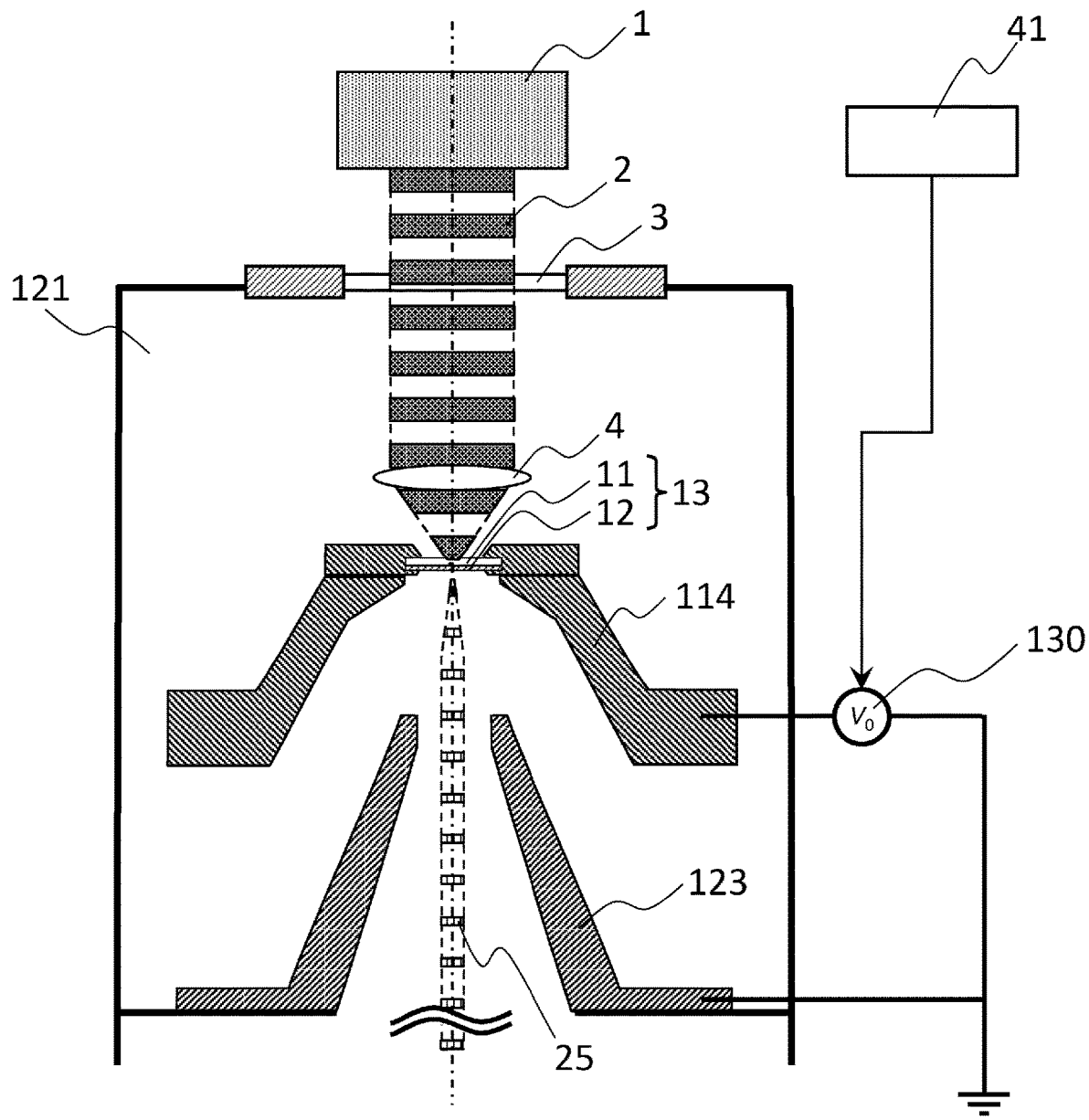
[FIG. 3]

[FIG. 4]
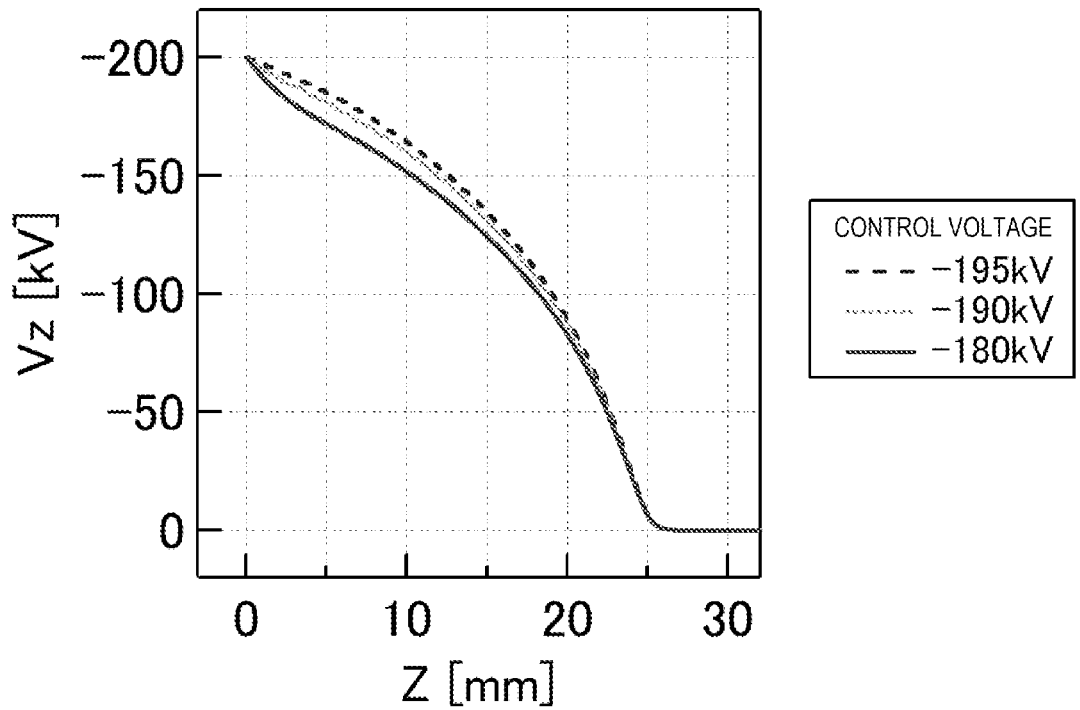
[FIG. 5]
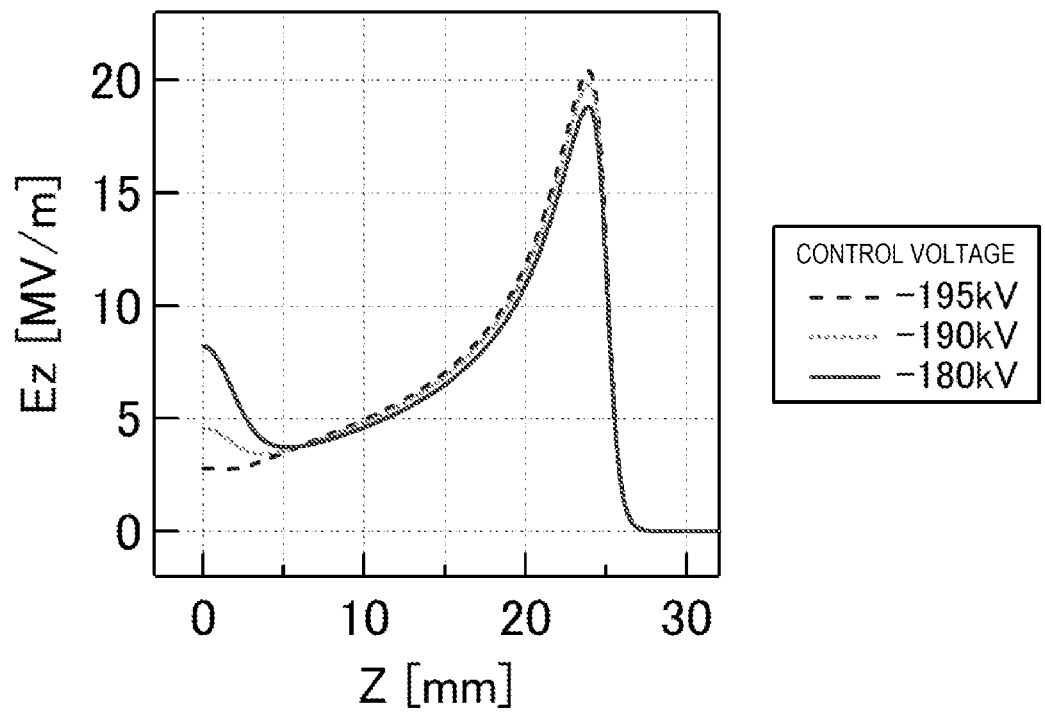

[FIG. 6]
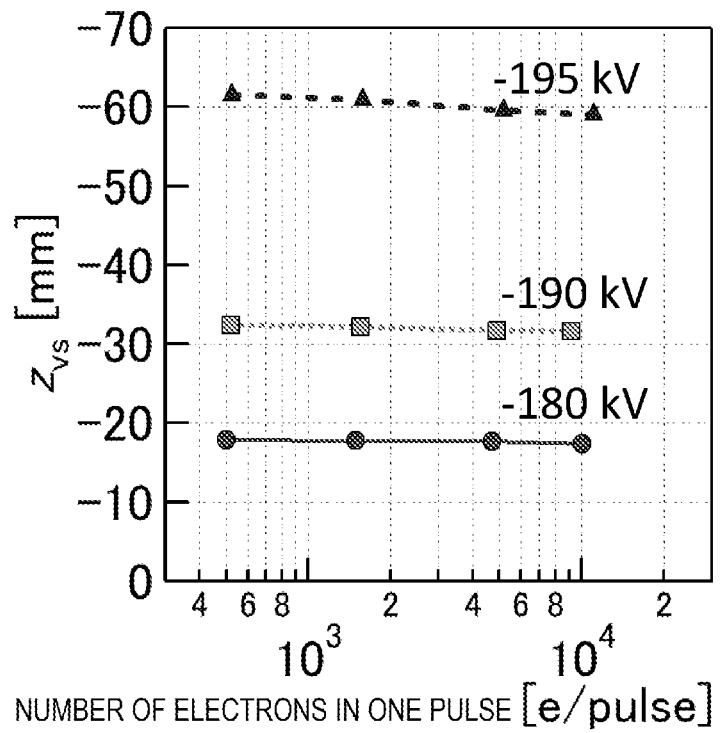
[FIG. 7]
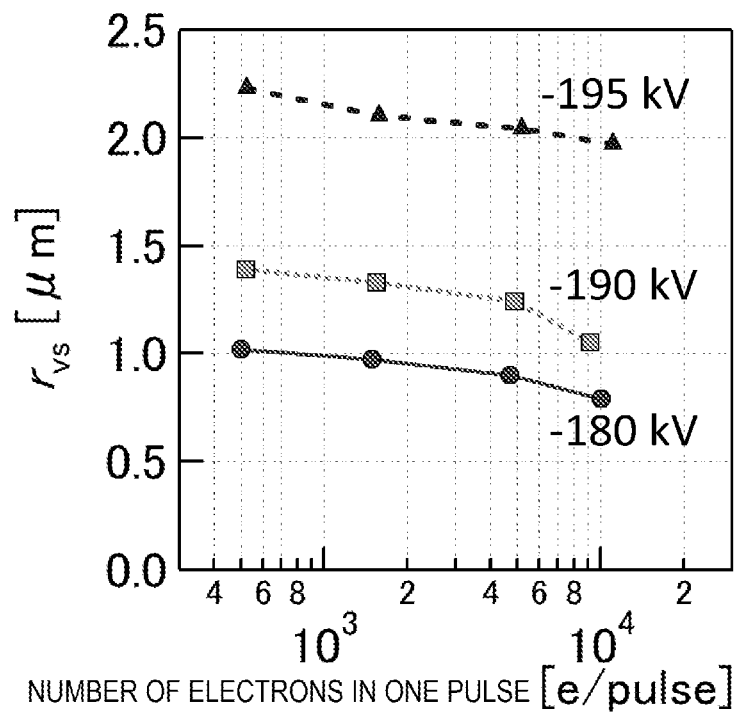

[FIG. 8]
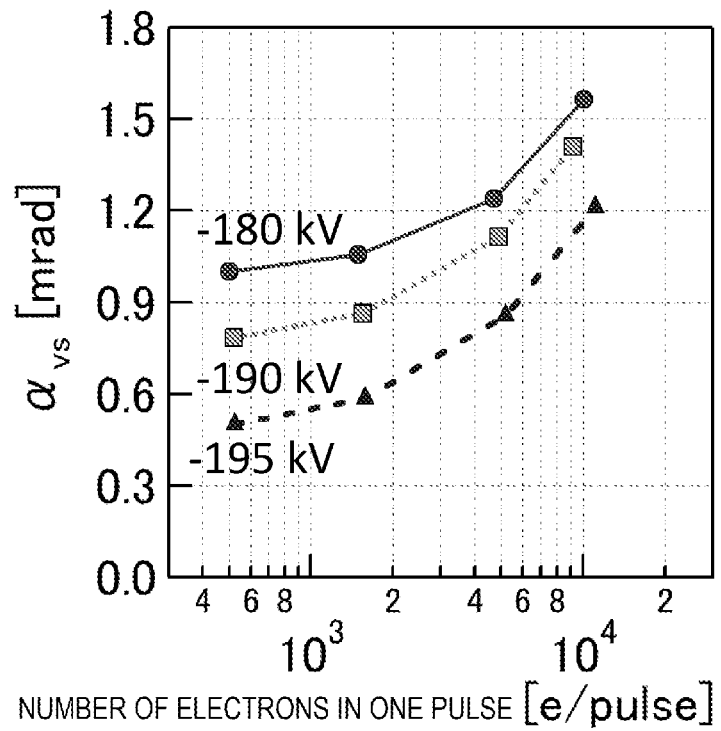
[FIG. 9]
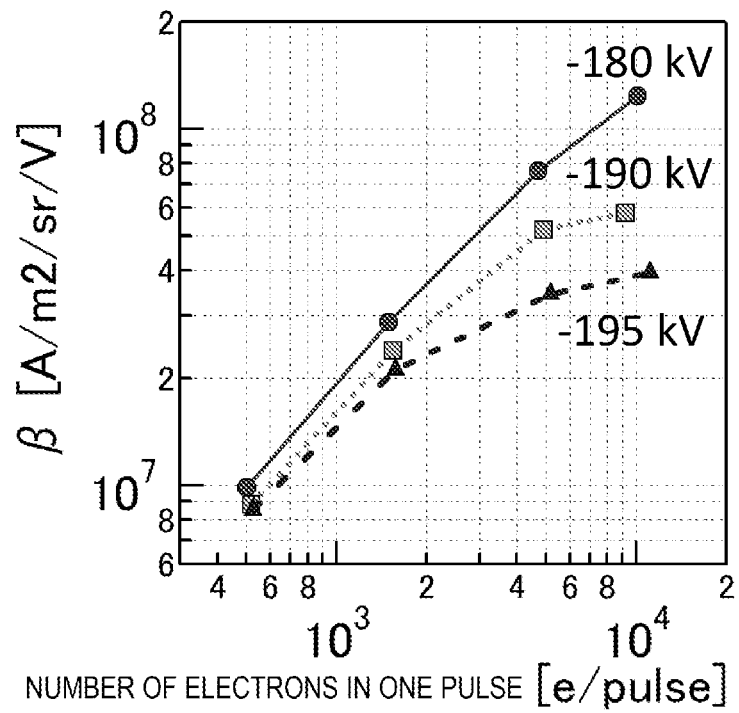

[FIG. 10]
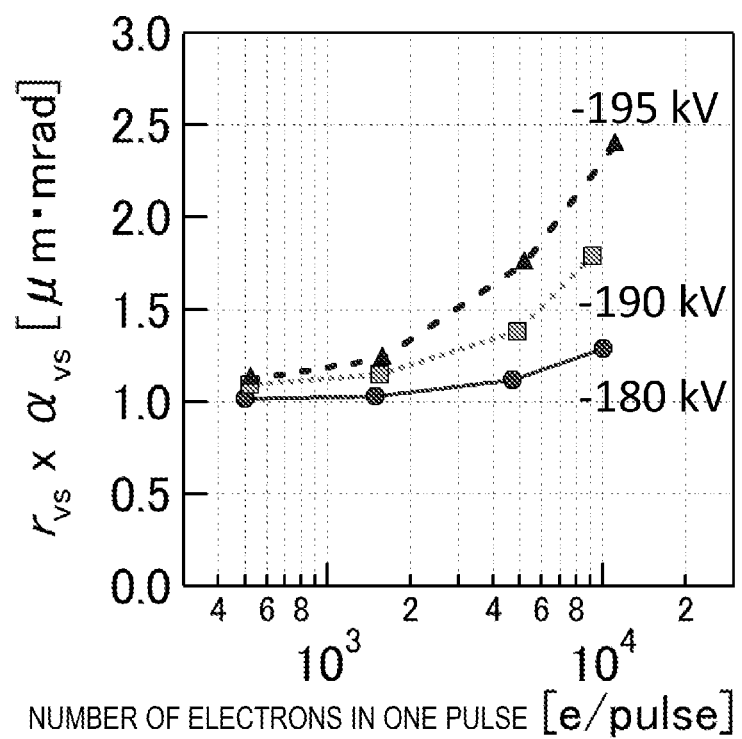

[FIG. 11]
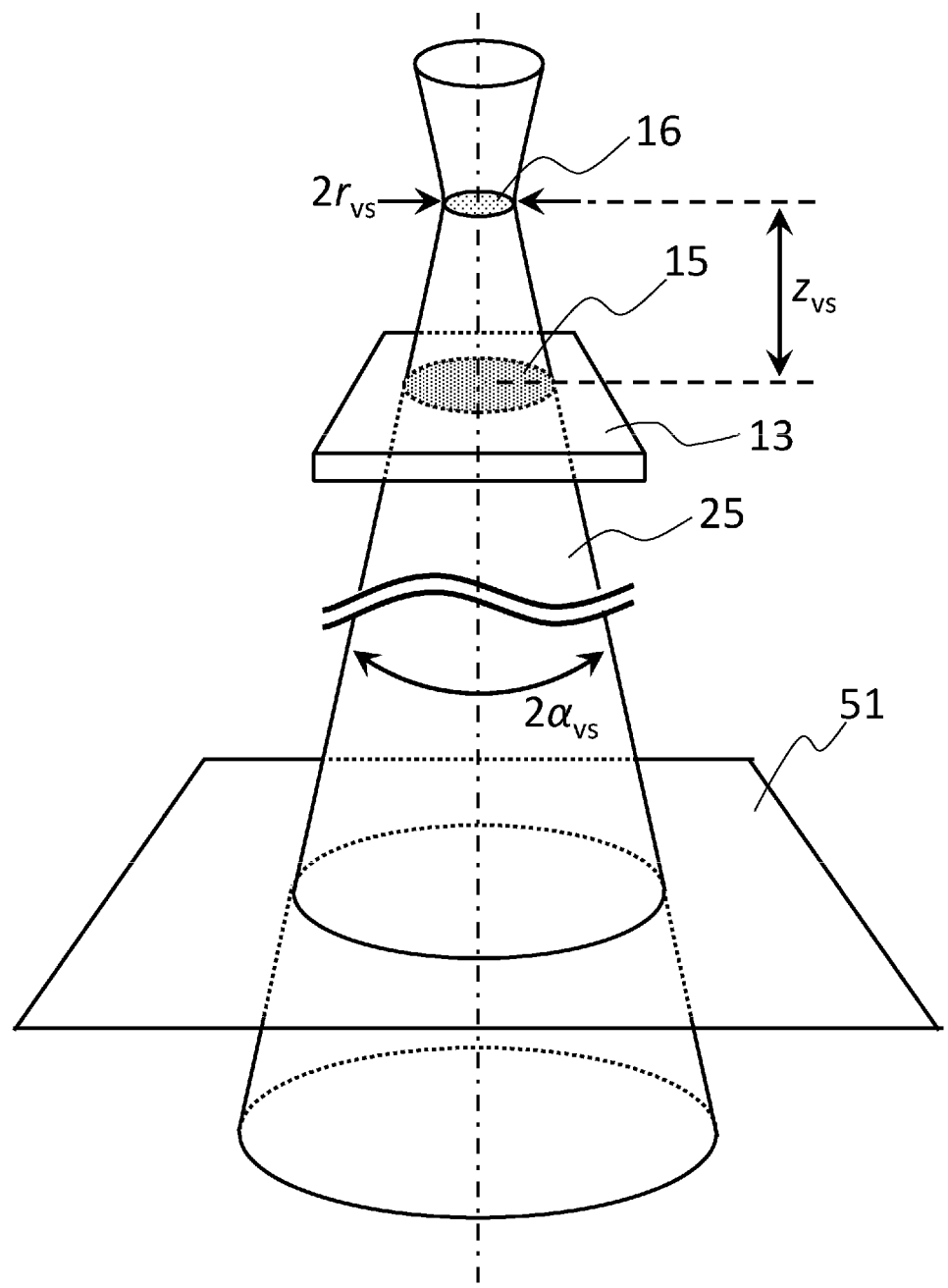

[FIG. 12]
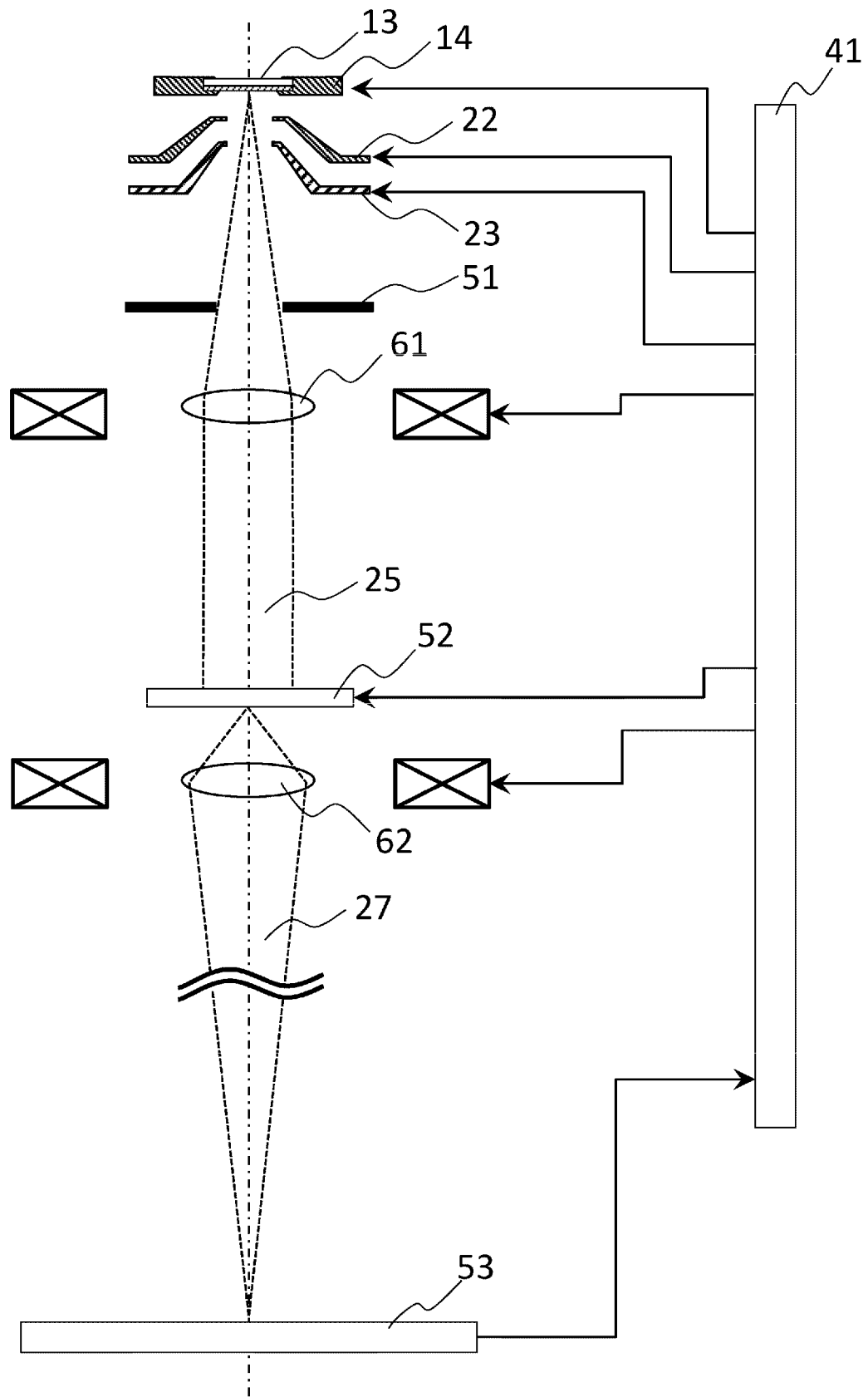

[FIG. 13]
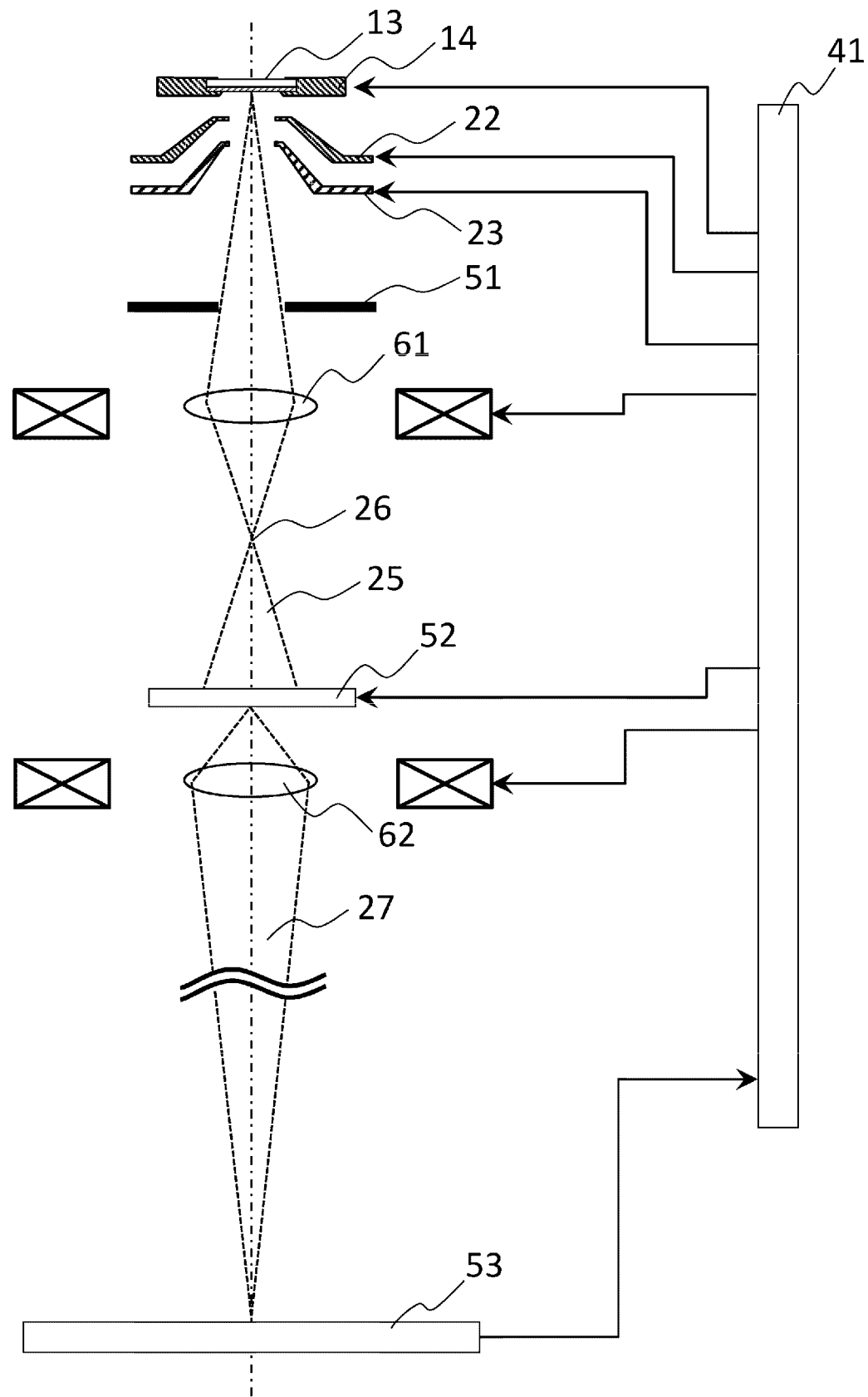

[FIG. 14]
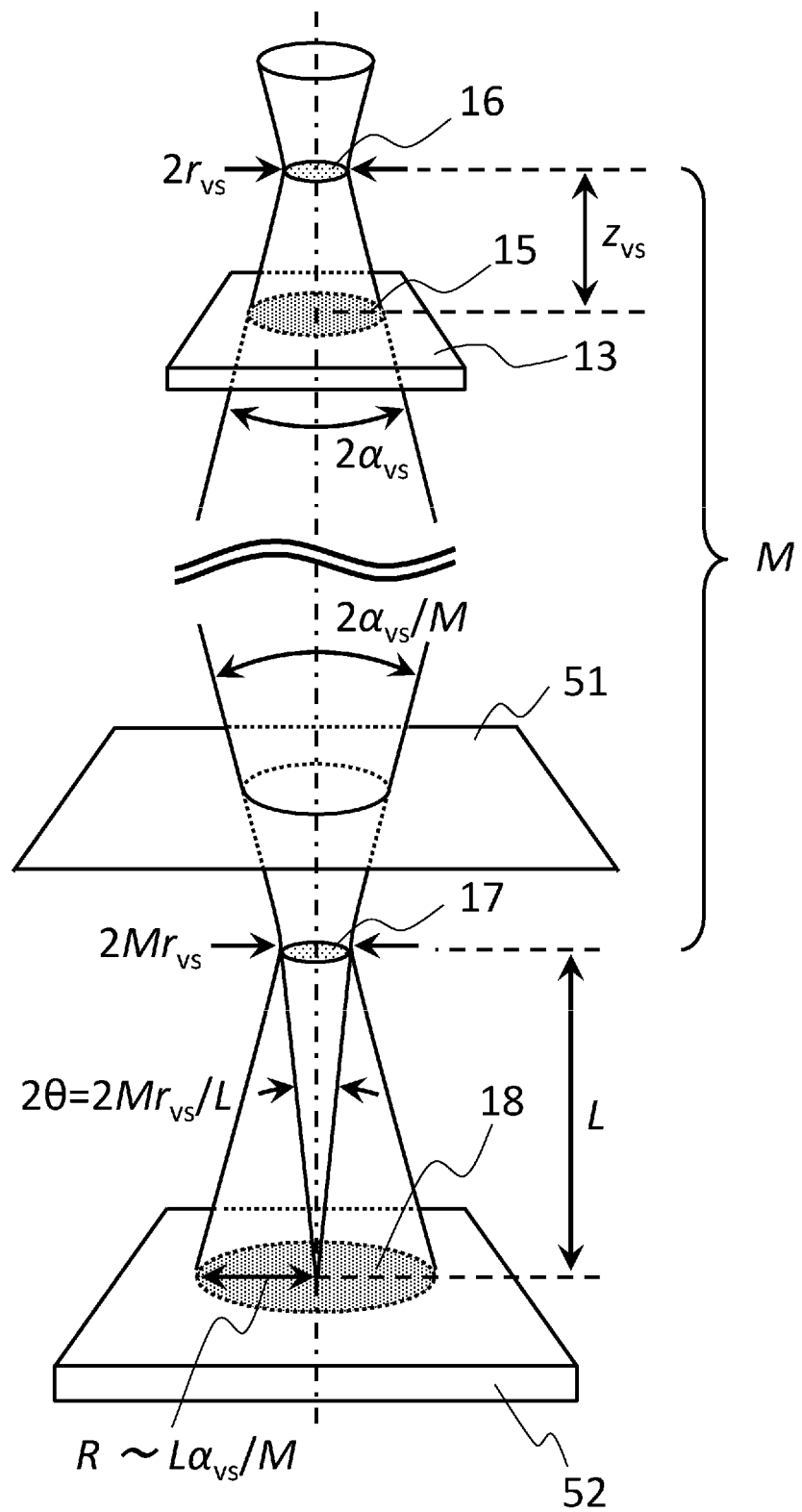

[FIG. 15]
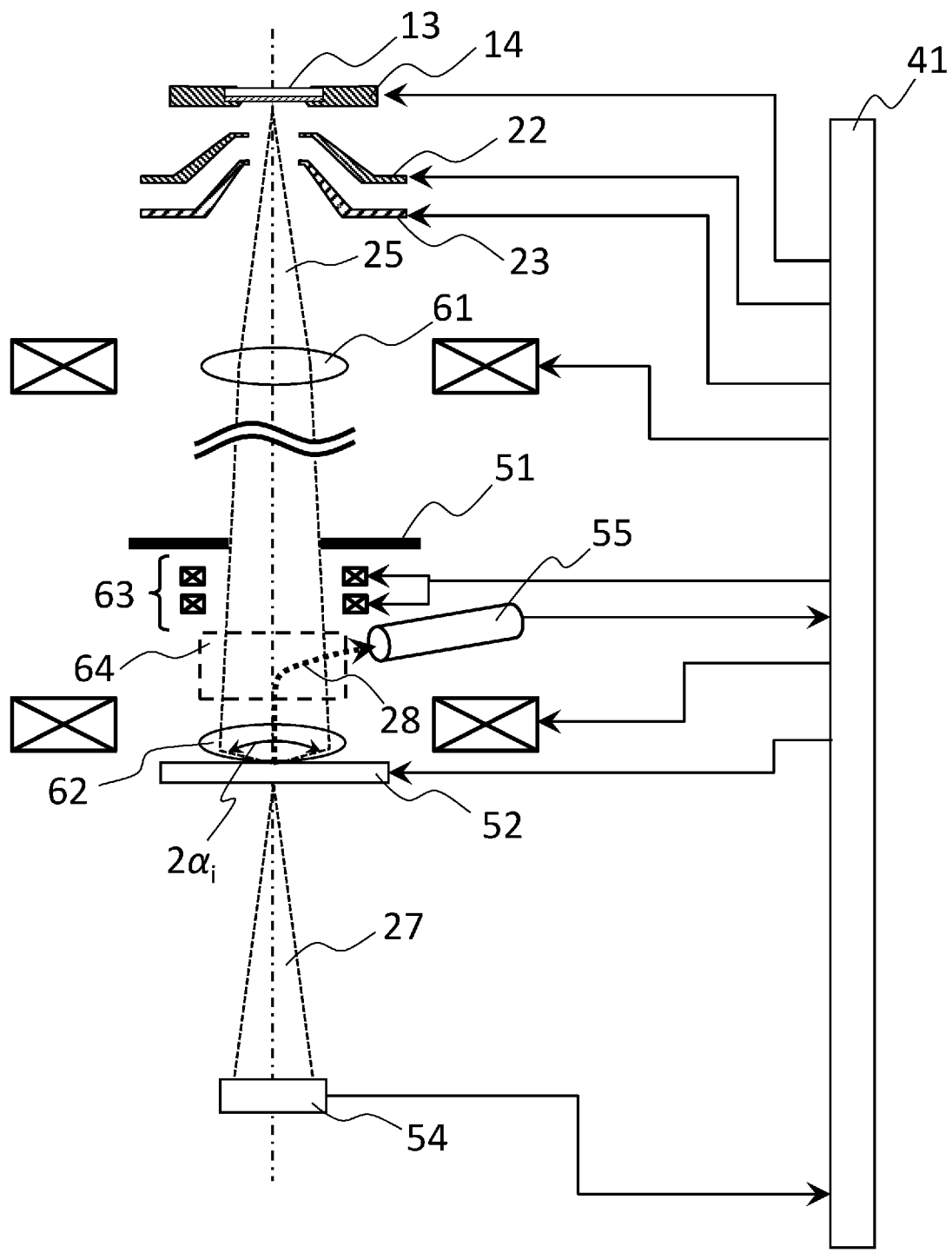

[FIG. 16]
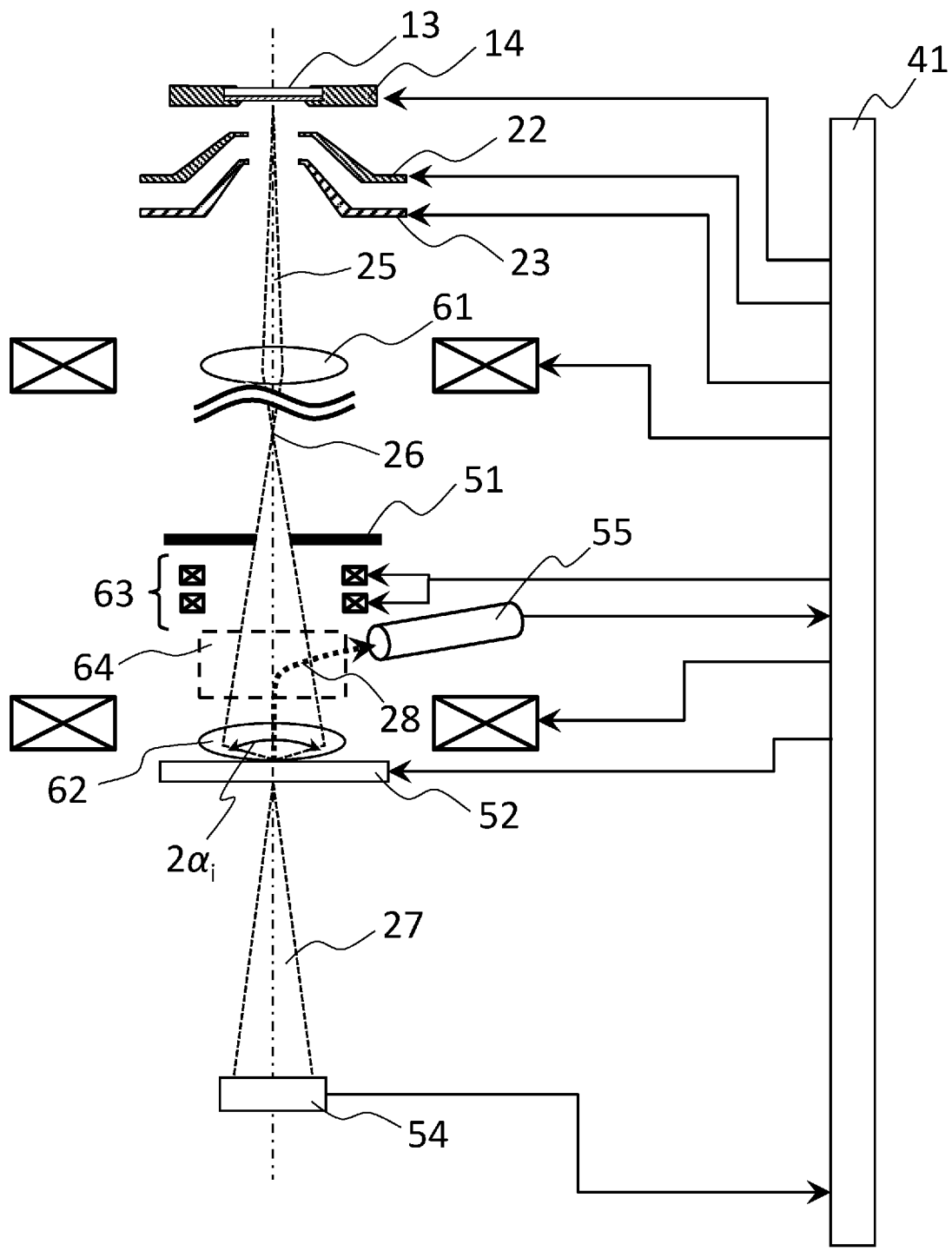

[FIG. 17]
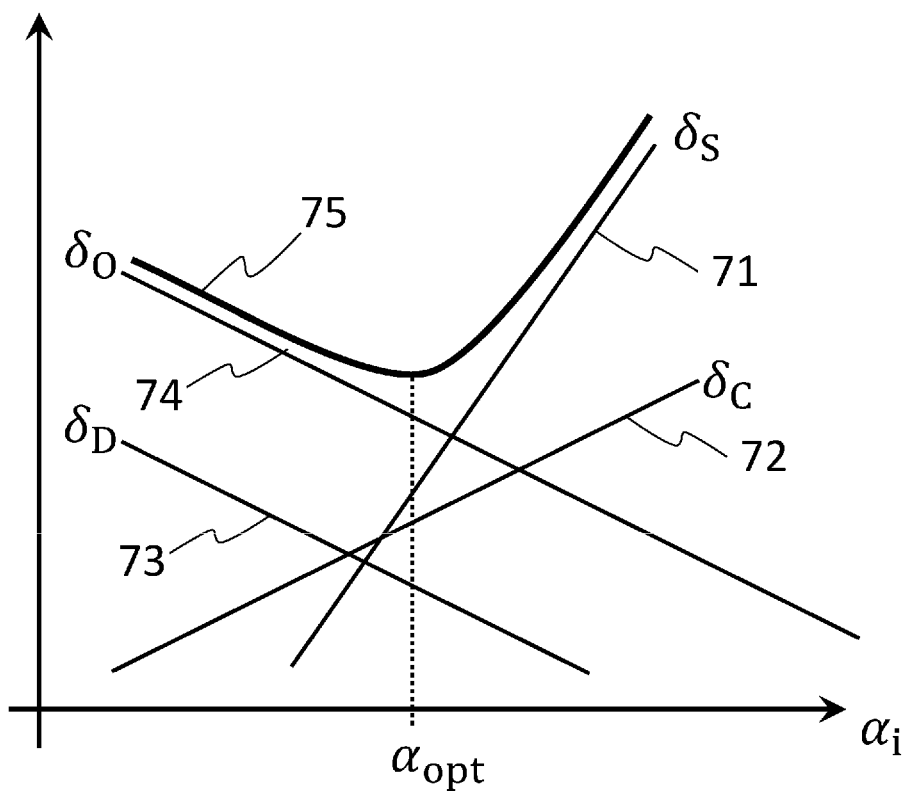

[FIG. 18]
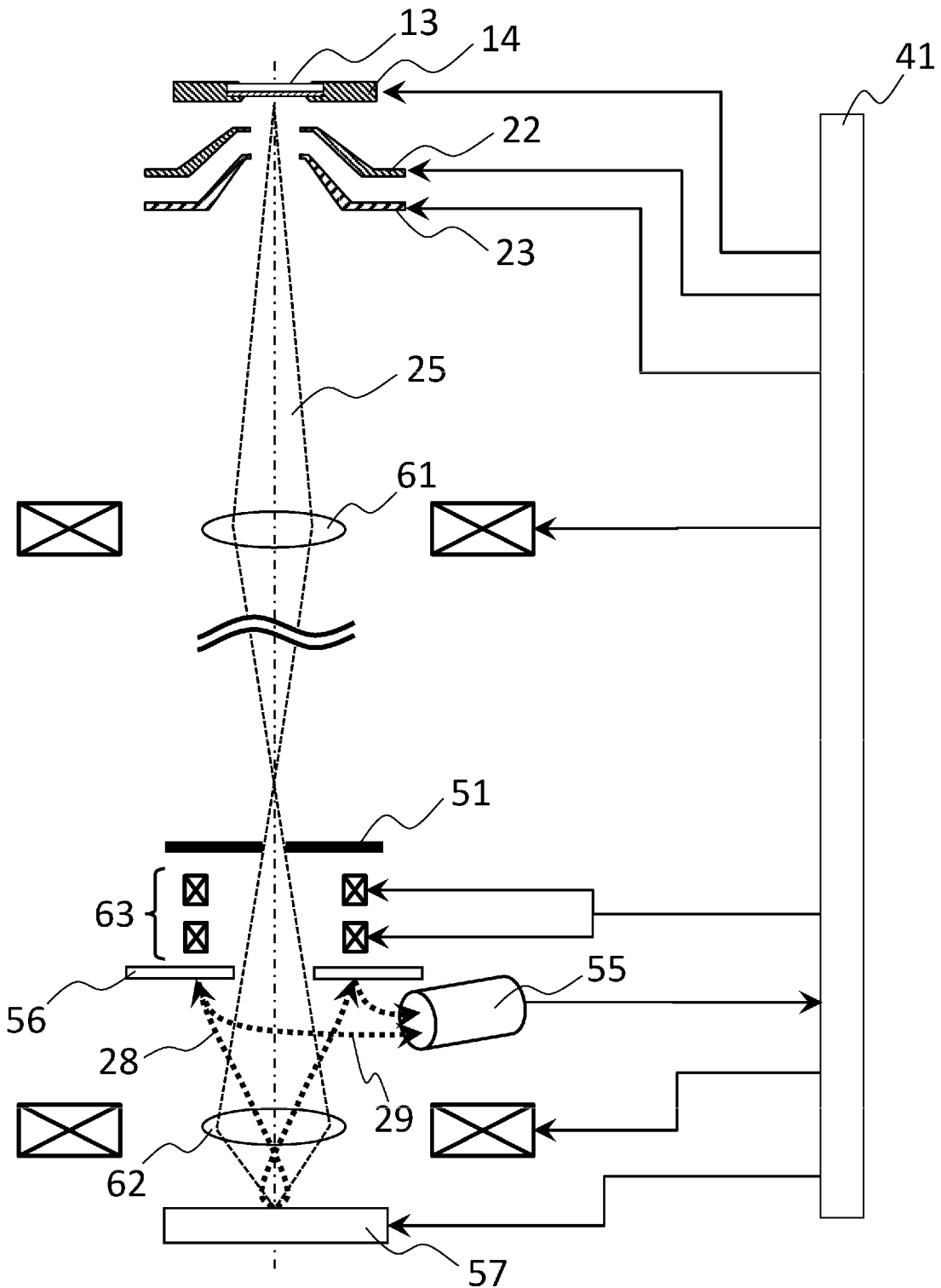

[FIG. 19]
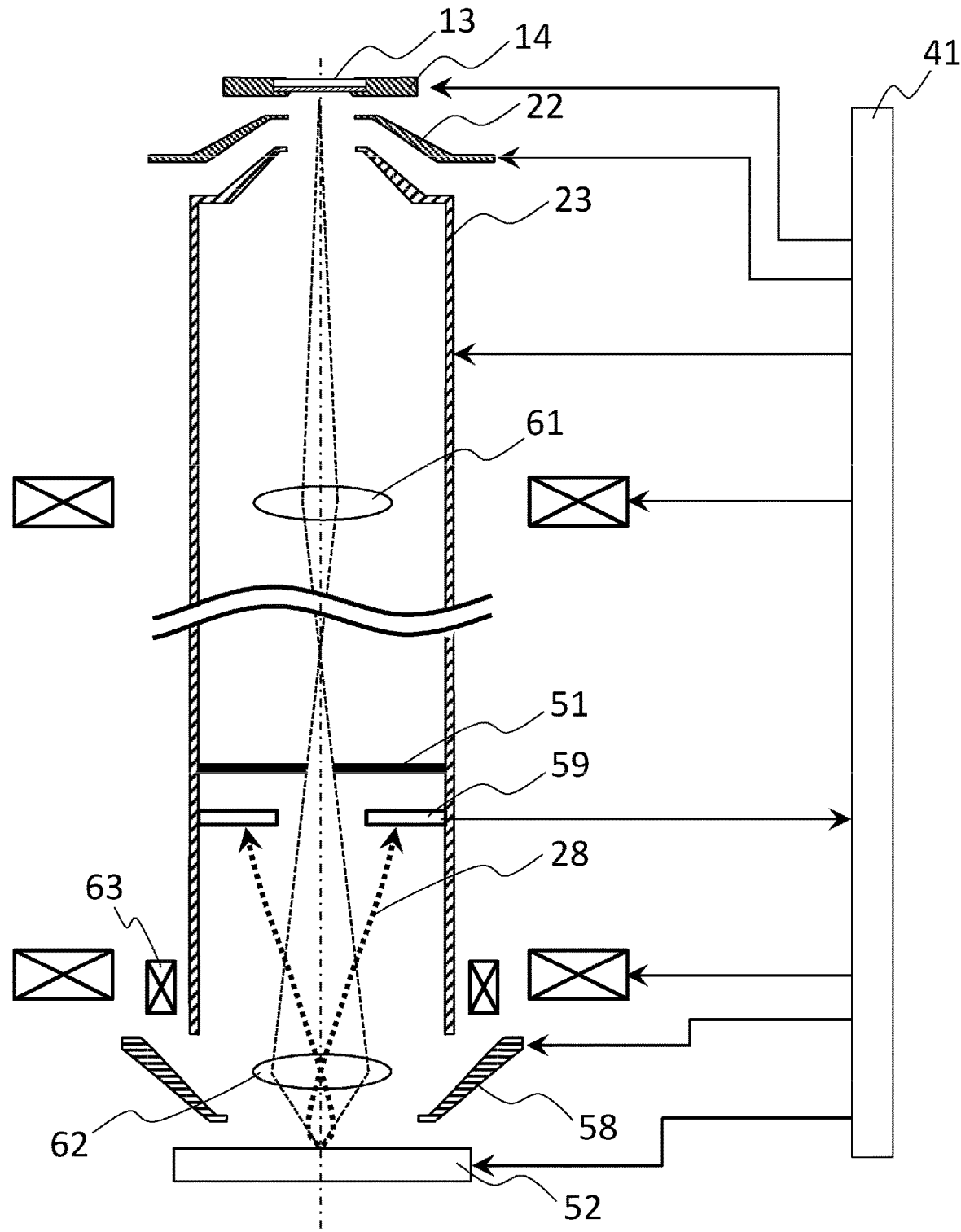

[FIG. 20]
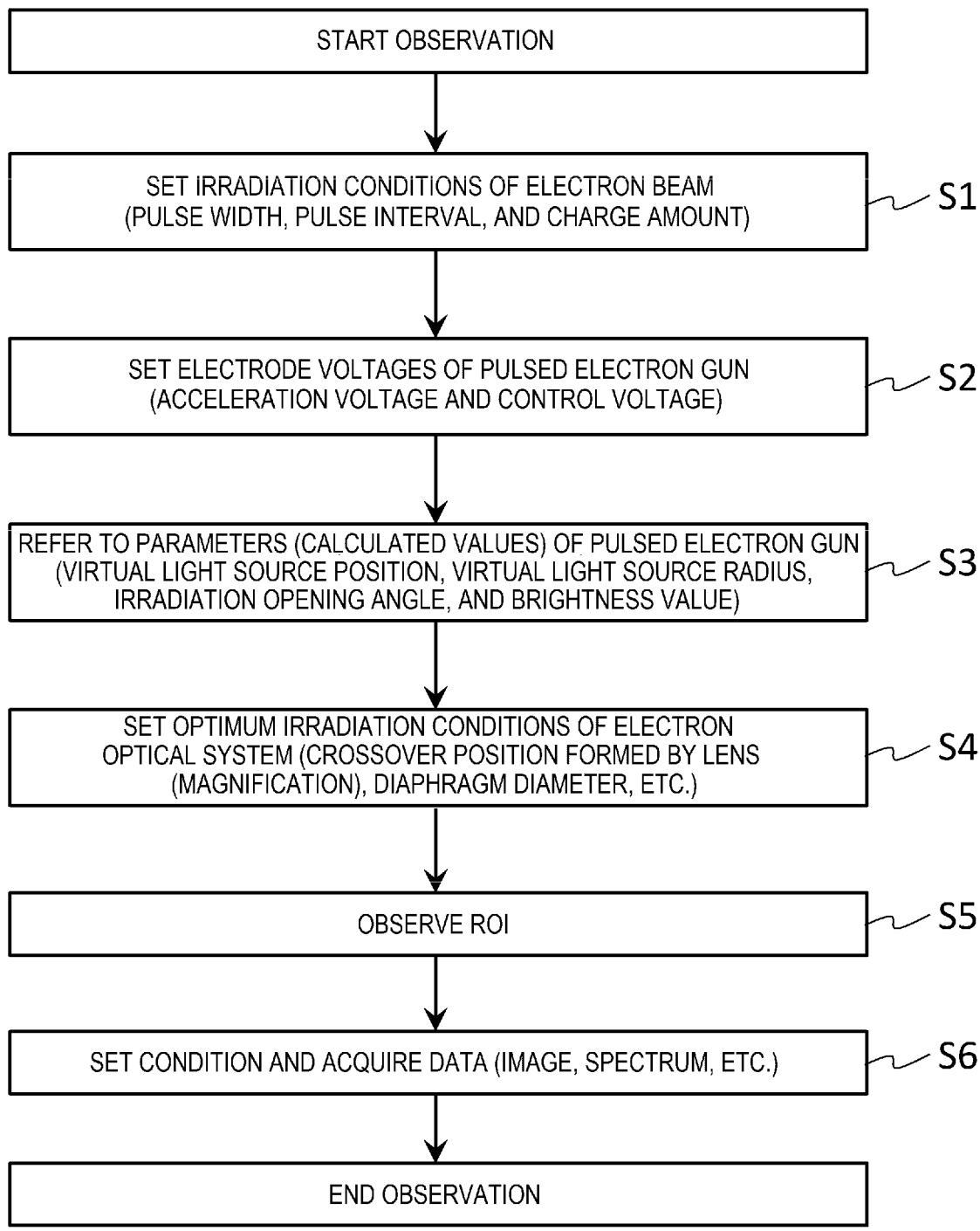

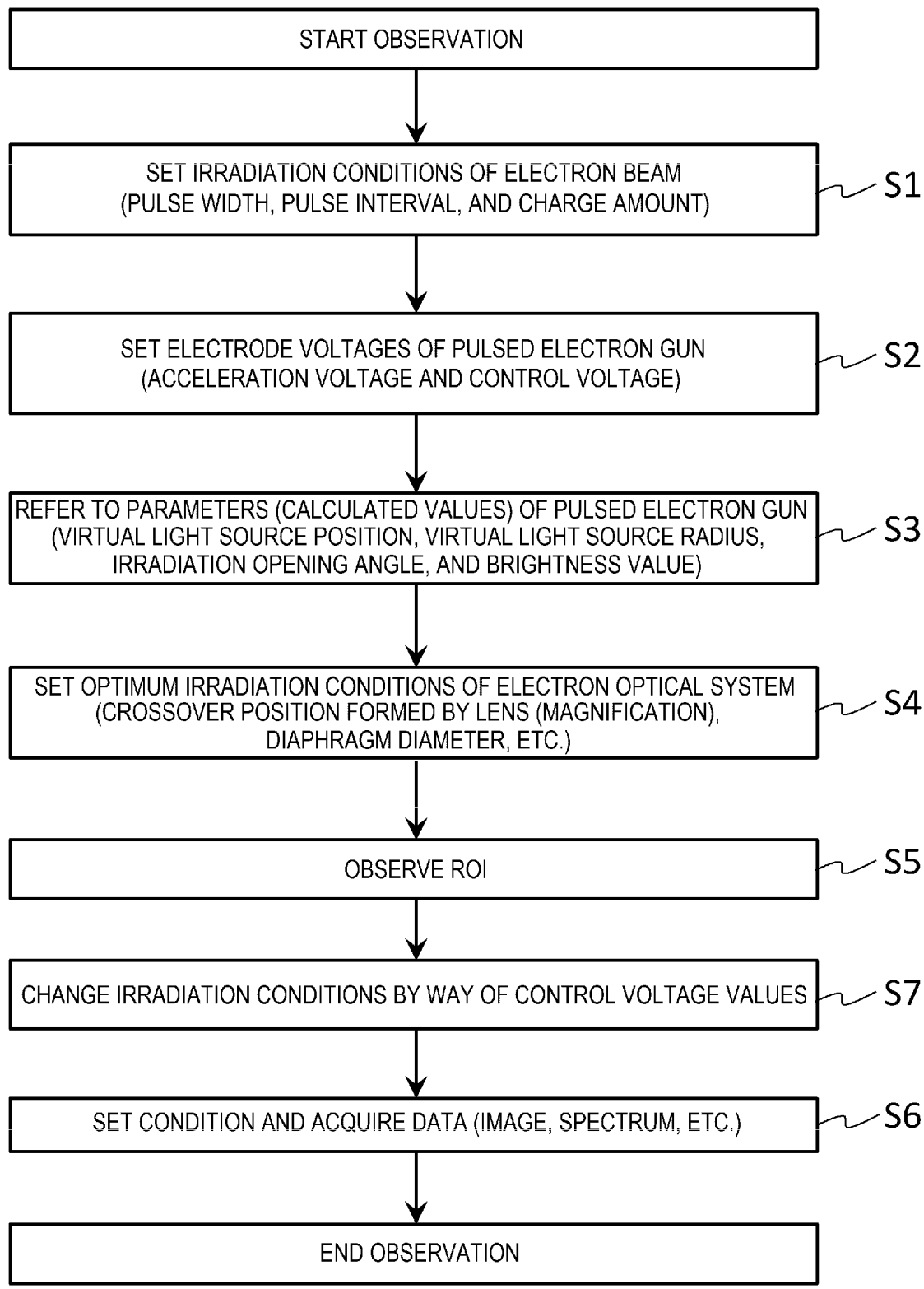
[FIG. 21]

ELECTRON GUN AND ELECTRON BEAM APPLICATION DEVICE

TECHNICAL FIELD

The present invention relates to an electron gun using a photocathode and an electron beam application device such as an electron microscope using the electron gun.

BACKGROUND ART

A microstructure of a sample can be measured by using an electron microscope that emits an accelerated electron beam and detects electrons interacting with the sample. PTL 1 discloses a device that dynamically visualizes, with high spatial resolution, a fast phenomenon such as a chemical reaction, a change in a biological structure, and a crystalline phase change, which occurs in a time scale from picoseconds to nanoseconds, by mounting a pulsed electron gun on an electron microscope and controlling a timing at which a sample is irradiated with a short-pulsed electron beam.

In recent years, a high brightness ($\sim 1 \times 10^7$ A/m²/sr/V) is reported (NPL 1) that is comparable to a brightness of a Schottky-type electron gun and generated by a photocathode electron source whose surface has a negative electron affinity (NEA). It is possible to easily short-pulse an electron beam by exciting, with a pulsed light, such an NEA photocathode having a high brightness. It is expected that a measurement can be performed with a high spatial resolution by using an electron microscope that is mounted with a pulsed electron gun provided with this NEA photocathode having the high brightness. For example, PTL 2 discloses a configuration of an electron gun using such an NEA photocathode.

PTL 3 discloses a configuration of an electron gun including a control anode electrode.

CITATION LIST

Patent Literature

PTL 1: JP2007-531876A
PTL 2: WO2019/151025
PTL 3: JPH10-112274A

Non Patent Literature

NPL 1: Kuwahara and others, "Coherence of a spin-polarized electron beam emitted from a semiconductor photocathode in a transmission electron microscope" Applied Physics Letters, Vol. 105, p. 193191, 2014

SUMMARY OF INVENTION

Technical Problem

A problem arises in a space charge effect in which when the number of electrons included in one pulse of a pulsed electron beam is increased, the electrons in the pulse occur coulomb repulsion with each other to change a trajectory and energy distribution of the electron beam. In a pulsed electron beam in which the space charge effect is obvious, an adverse effect occurs such as a decrease in a brightness and an increase in an energy width. When a comparison is performed under a condition in which the number of electrons per pulse is the same, the shorter a pulse width, the more obvious the adverse effect of the space charge effect.

In a case of a sample in which transition between a ground state and an excited state reversibly changes, for example, as disclosed in PTL 1, by applying an optical pump and electron probe method using the electron beam to a measurement of a sample excited by irradiation with a light, it is possible to measure the fast phenomenon occurring in a short time. This method is a method of performing a time resolved measurement by controlling a timing until the measurement is performed after the sample is excited. When a reversible process is measured, an integration signal can be detected by repeating the measurement, and thus it is possible to select a condition under which the space charge effect is not a problem.

However, in a case of a sample in which transition between a ground state and an excited state irreversibly changes, the integration signal cannot be detected by repeating the measurement, and thus it is necessary to obtain a sufficient measurement signal by irradiation with one pulse of an electron beam. However, when the number of electrons included in one pulse is increased, the spatial resolution may be deteriorated due to the space charge effect. Therefore, when an irreversible process is measured by a single-shot measurement, it is not possible to achieve both high time resolution and high spatial resolution.

The electron gun disclosed in PTL 3 has a common point with a configuration of an electron gun according to an embodiment described below in that the electron gun disclosed in PTL 3 includes the control anode electrode disposed between a cathode and an anode. However, the electron gun in PTL 3 is an electron gun used in electron-beam reduction lithography, and the control anode electrode is provided to increase emittance of the electron gun. Therefore, PTL 3 and the embodiment described below have completely different purposes.

Solution to Problem

An electron gun according to an embodiment of the invention includes: a photocathode including a substrate and a photoelectric film formed on the substrate; a light source configured to emit a pulsed excitation light; a condenser lens facing the substrate of the photocathode and configured to condense the pulsed excitation light toward the photocathode; a first anode electrode and a second anode electrode facing the photoelectric film of the photocathode; a first power supply configured to apply a first control voltage between the first anode electrode and the second anode electrode; and a second power supply configured to apply an acceleration voltage between the photocathode and the second anode electrode.

The first anode electrode is disposed between the photocathode and the second anode electrode. A surface of the first anode electrode facing the second anode electrode has a recessed shape, and a surface of the second anode electrode facing the first anode electrode has a protruding shape.

The first control voltage is set such that the photocathode has a surface electric field intensity higher than a surface electric field intensity when the acceleration voltage is applied to the second anode electrode in the absence of the first anode electrode.

An electron beam application device according to an embodiment of the invention includes: an electron optical system including an electron gun and configured to irradiate a sample with a pulsed electron beam emitted from the electron gun; a detector configured to detect, by irradiating the sample with the pulsed electron beam, electrons transmitted through the sample or electrons emitted by interaction with the sample; and a control unit configured to control an irradiation condition of the pulsed electron beam emitted from the electron optical system to the sample.

The electron gun includes: a photocathode including a substrate and a photoelectric film formed on the substrate; a light source configured to emit a pulsed excitation light; a condenser lens facing the substrate of the photocathode and configured to condense the pulsed excitation light toward the photocathode; and a first anode electrode and a second anode electrode facing the photoelectric film of the photocathode.

The first anode electrode is disposed between the photocathode and the second anode electrode. A surface of the first anode electrode facing the second anode electrode has a recessed shape, and a surface of the second anode electrode facing the first anode electrode has a protruding shape.

The control unit optimizes the irradiation condition of the pulsed electron beam emitted from the electron optical system to the sample according to a parameter of the electron gun under a predetermined pulse condition set for the electron gun.

Advantageous Effects of Invention

In a pulsed electron gun using a photocathode, it is possible to prevent deterioration in a brightness of the electron gun caused by a space charge effect, and it is possible to execute a measurement in which both high temporal resolution and high spatial resolution are achieved.

Other technical problems and novel characteristics will be apparent from a description of the present specification and the accompanying drawings.

BRIEF DESCRIPTION OF DRAWINGS

FIG. 1 is a diagram showing an outline of a pulsed electron gun according to Embodiment 1.

FIG. 2 is a diagram showing an outline of the pulsed electron gun according to Embodiment 1.

FIG. 3 is a diagram showing an outline of a pulsed electron gun in the related art.

FIG. 4 is a graph of an axial potential distribution of the pulsed electron gun according to Embodiment 1.

FIG. 5 is a graph of an axial electric field intensity distribution of the pulsed electron gun according to Embodiment 1.

FIG. 6 is a graph of electron number dependence on a virtual light source position of the pulsed electron gun according to Embodiment 1.

FIG. 7 is a graph of electron number dependence on a virtual light source radius of the pulsed electron gun according to Embodiment 1.

FIG. 8 is a graph of electron number dependence on an irradiation aperture angle of the pulsed electron gun according to Embodiment 1.

FIG. 9 is a graph of electron number dependence on a converted brightness of the pulsed electron gun according to Embodiment 1.

FIG. 10 is a graph of electron number dependence on emittance of the pulsed electron gun according to Embodiment 1.

FIG. 11 is a diagram showing definitions of the virtual light source position, the virtual light source radius, and the irradiation aperture angle of the pulsed electron gun.

FIG. 12 is a diagram showing an outline of an electron beam application device according to Embodiment 2.

FIG. 13 is a diagram showing an outline of the electron beam application device according to Embodiment 2.

FIG. 14 is a diagram showing definitions of an irradiation angle and an irradiation region of an electron beam on a sample.

FIG. 15 is a diagram showing an outline of an electron beam application device according to Embodiment 3.

FIG. 16 is a diagram showing an outline of the electron beam application device according to Embodiment 3.

FIG. 17 is a diagram showing an optimum irradiation angle.

FIG. 18 is a diagram showing an outline of an electron beam application device according to Embodiment 4.

FIG. 19 is a diagram showing an outline of the electron beam application device according to Embodiment 4.

FIG. 20 is a flowchart showing a procedure for setting control values of the electron beam application device.

FIG. 21 is a flowchart showing a procedure for setting the control values of the electron beam application device.

DESCRIPTION OF EMBODIMENTS

Hereinafter, embodiments of the invention will be described in detail with reference to the drawings.

Embodiment 1

FIG. 1 shows a configuration example of a pulsed electron gun. A pulsed electron gun 21 is a part of elements incorporated in an electron beam application device that is typified by an electron microscope. An electron microscope incorporated with the pulsed electron gun described in the present embodiment will be described in detail as Embodiments 2 to 4.

The pulsed electron gun 21 includes: a photocathode 13 that includes a photoelectric film 12 formed on a transparent substrate 11; a pulsed light source 1 that excites the photocathode 13; a condenser lens 4 that condenses a pulsed excitation light 2 to the photocathode 13; a first anode electrode 22 that controls an electric field intensity of the photocathode 13; and a second anode electrode 23 that accelerates an electron beam to a final energy. For a purpose of improving controllability for an irradiation angle, an amount of irradiation current, and the like of an electron optical system by the pulsed electron gun 21, a third anode electrode 24 capable of varying the applied voltage may be added as shown in FIG. 2. A cathode electrode 14, the first anode electrode 22, the second anode electrode 23, and the third anode electrode 24 are connected to power supplies 30 to 33, respectively, and a potential of each of the electrodes is controlled. When the potential of the second anode electrode 23 is always set to a reference potential, the power supply 32 may be omitted. As will be described later, a part of the second anode electrode 23 may be configured as an accelerating tube that accelerates and transports the electron beam.

In FIG. 1, only peripheral structures of the photocathode 13 are shown, and an extremely high vacuum is maintained around the photocathode 13 by a differential exhaust diaphragm, a vacuum chamber, vacuum exhaust equipment, and the like (not shown). As the vacuum exhaust equipment, an ion pump, a non-evaporable getter pump, or the like is connected. The photoelectric film 12 is preferably a p-type semiconductor including GaAs, and a surface thereof is an NEA surface whose energy level at a lower end of a conduction band is higher than a vacuum level. When the photoelectric film 12 having the NEA surface is irradiated with an excitation light having a wavelength corresponding to a band gap of the photoelectric film 12, electrons excited from a valence band to the conduction band are efficiently emitted, and thus the electrons can be used as an irradiation electron beam of the electron microscope. In particular, the NEA photocathode using GaAs as the photoelectric film emits an electron beam having a small energy width of 0.2 eV or less, and is effective for a measurement in which energy resolution is required.

The photocathode 13 is placed together with the condenser lens 4 in the vacuum chamber of the electron gun. Meanwhile, the pulsed light source 1 serving as an excitation light source that excites the photocathode 13 is placed outside the vacuum chamber. The pulsed excitation light 2 passes through a viewing port 3 and is condensed on the photoelectric film 12 by the condenser lens 4 that is disposed in the vicinity of a transparent substrate 11 side of the photoelectric film 12. Electrons emitted from a point at which the light is condensed are used as the irradiation electron beam of the electron microscope. An output of the pulsed excitation light 2 from the pulsed light source 1 may be a spatial light output or an optical fiber output as long as the output satisfies an irradiation intensity required for obtaining a required pulsed electron beam. According to the arrangement shown in FIG. 1, it is possible to condense, in the photoelectric film 12, the pulsed excitation light 2 with a numerical aperture (NA) of 0.5 or more, and to achieve a condensed light diameter comparable to that at a diffraction limit. In particular, an optimum excitation wavelength for the photoelectric film 12 that mainly includes GaAs is in a range of 700 to 800 nm, and the condensed light diameter, when condensed at the diffraction limit, is about φ1 μm. Since a pulsed electron beam 25 emitted from the NEA surface has a narrow angular range of about 10 degrees or less, an electron source having a high brightness is obtained. Hereinafter, unless otherwise specified, it is assumed that the pulsed excitation light 2 is condensed on the photoelectric film 12 of the photocathode 13 as shown in FIG. 1.

As compared with a field emission type electron source in which an electric field is concentrated on an electrode tip portion sharpened to a tip diameter φ of about 10 to 100 nm to emit an electron beam, a photocathode electron source whose photoelectric film has an NEA surface has an electron emission region having a large diameter of φ1 μm. Therefore, when the photocathode electron source is compared with the field emission type electron source under a condition in which electron beams have the same electron density, the photocathode electron source is more advantageous than the field emission type electron source in that in the photocathode electron source, the electron beam emitted from a wider space is used, and thus a distance between electrons in the electron emission region is large, and a space charge effect is difficult to become obvious even when the electron beam is short-pulsed.

An electron beam is emitted when the photocathode 13 is irradiated with an excitation light in a state in which a voltage is applied to each of the electrodes. The electron beam 25 emitted by irradiating the photocathode 13 with the pulsed excitation light 2 as the excitation light is pulsed. Since the pulsed electron beam 25 emitted from the photocathode 13 has a pulse waveform similar to that of the pulsed excitation light 2, a pulse width and a pulse interval of the pulsed electron beam are substantially the same as a pulse width and a pulse interval of the pulsed excitation light 2. When timing control of a pulsed irradiation electron beam is required, for example, in a single shot measurement or a pump and probe measurement, a pulse generator, a delay controller, and the like that perform synchronization control with an imaging system of the electron microscope and an excitation light source for a sample are connected to the pulsed light source.

When an optical path adjustment for the excitation light and an alignment adjustment for the electron optical system are performed or when a comparison between a continuous electron beam and the pulsed electron beam is necessary, the excitation light source is preferably configured such that both the pulsed light source and a continuous light source are connected to each other and can be switched to be used. In order to avoid an adverse effect of axial misalignment which becomes a problem when the anode electrodes have a plurality of stages, the first anode electrode 22 or the second anode electrode 23 may include partial electrodes obtained by equally dividing the first anode electrode 22 or the second anode electrode 23 in an azimuthal direction, and the partial electrodes may be disposed symmetrically about an optical axis. According to this configuration, it is also possible to superimpose a deflection field for adjusting an alignment of the pulsed electron beam 25 to a component such as the differential exhaust diaphragm that limits an irradiation angle of the electron beam. An electrostatic deflector for alignment may be separately provided in an electron gun chamber. It is important for the electron gun to have an extremely high vacuum region in a chamber (electron gun chamber) in which the photocathode 13 is placed. Therefore, it is necessary that a member in the chamber is bakeable, and from this viewpoint, the electrostatic deflector is more preferable than an electromagnetic deflector.

FIG. 3 shows an electron gun structure in the related art using the photocathode 13. This structure is a two-electrode structure in which a cathode electrode 114 and an anode electrode 123 face each other. The cathode electrode 114 has a recessed surface with respect to the anode electrode 123, and the anode electrode 123 has a protruding surface with respect to the cathode electrode 114. This electrode structure is called Pierce type, and an electrostatic lens effect is obtained in which a convex lens effect caused by an electric field distributed between the cathode electrode 114 and the anode electrode 123 is enhanced. Although an effect of preventing spread of the electron beam 25 in a lateral direction is obtained according to this electrode structure, an acceleration electric field intensity on a surface of the photocathode 13 is reduced since a periphery of an electron emission region is surrounded by the electrode 114 having a cathode potential. The space charge effect is a phenomenon mainly caused by coulomb repulsion between electrons, and thus the space charge effect appears most strongly in a region in which an energy of the electrons immediately after emission from the photocathode 13 is small. With respect to this, in the electrode structure according to the present embodiment, the first anode electrode 22 is disposed between the second anode electrode 23 and the cathode electrode 14 and is disposed close to the photocathode 13. A surface of the first anode electrode 22 facing the second anode electrode 23 has a recessed shape, and a surface of the second anode electrode 23 facing the first anode electrode 22 has a protruding shape. When the third anode electrode 24 is provided as shown in FIG. 2, the surface of the first anode electrode 22 facing the third anode electrode 24 has a recessed shape, a surface of the third anode electrode 24 facing the first anode electrode 22 has a protruding shape, a surface of the third anode electrode 24 facing the second anode electrode 23 has a recessed shape, and the surface of the second anode electrode 23 facing the third anode electrode 24 has a protruding shape. According to this structure, it is possible to prevent an influence of the space charge effect on the electrons immediately after emission, which is the problem of the electron gun structure shown in FIG. 3, while obtaining an effect of the Pierce type electrode structure. The electrons are influenced by the electrostatic lens action in a region of the vicinity of the optical axis, and in the electron gun structure shown in FIGS. 1 and 2, a tip portion of the first anode electrode 22 and the photocathode 13 are disposed close to each other in the region, and thus the cathode electrode 14 is implemented as a flat plate electrode.

In order to verify an effect of the first anode electrode 22, an electric field intensity distribution and an electron beam trajectory of the pulsed electron gun in FIG. 1 were calculated. In this calculation, a transmission electron microscope (TEM) or a scanning transmission electron microscope (STEM) was assumed as an electron beam application device mounted with the electron gun, and an electron gun structure with an irradiation energy of 200 keV was used. A cathode electrode voltage $V_0$ applied by the power supply 30 was set to −200 kV. A first anode electrode voltage $V_1$ applied by the power supply 31 was set to −180—−195 kV. A second anode electrode voltage $V_2$ applied by the power supply 32 was set to 0 V. In the following description, a voltage applied between the first anode electrode 22 and the second anode electrode 23 may be referred to as a control voltage (in this embodiment, the first anode electrode voltage $V_1$), and a voltage applied between the cathode electrode 14, and thus the photocathode 13, and the second anode electrode 23 may be referred to as an acceleration voltage (in this embodiment, the cathode electrode voltage $V_0$). A gap $d_1$ between the cathode electrode 14 and the first anode electrode 22 was set to 1.5 mm. A gap $d_2$ between the first anode electrode 22 and the second anode electrode 23 was set to 23 mm considering that a potential difference between the two electrodes was up to about 200 kV.

An axial electric potential distribution under this condition is shown in FIG. 4, and an axial electric field intensity under this condition is shown in FIG. 5. In FIGS. 4 and 5, an electron emission surface of the photocathode 13 corresponds to Z=0 mm, the first anode electrode 22 corresponds to Z=2 mm, and a tip portion of the second anode electrode 23 corresponds to Z=25 mm. In each of the two diagrams, waveforms when the control voltage $V_1$=−195 kV, −190 kV, and −180 kV are indicated by a broken line, a dotted line, and a solid line, respectively. When the control voltage $V_1$=−195 kV, the electric potential distribution and the electric field distribution of the electron gun according to the present embodiment are a potential distribution and an electric field distribution substantially the same as those of the electron gun in the related art shown in FIG. 3. Therefore, when the electron gun according to the present embodiment is compared with the electron gun in the related art, regarding parameters such as a virtual light source radius, an irradiation aperture angle, a brightness, emittance, and the like, a value calculated under a condition of the control voltage $V_1$=−195 kV is used as a value of the electron gun in the related art.

As shown in FIG. 5, an absolute value of the axial electric field intensity at Z=0 mm is about 3 MV/m when the control voltage $V_1$=−195 kV, whereas the absolute value is 8 MV/m when the control voltage $V_1$=−180 kV. It can be seen that a surface electric field of the photocathode 13 can be controlled by changing the control voltage applied to the first anode electrode 22. Specifically, a surface electric field intensity of the photocathode 13 increases in the order of −195 kV, −190 kV, and −180 kV of the control voltage $V_1$.

When the control voltage $V_1$ is applied to the first anode electrode 22 and a condition is set such that the surface electric field of the photocathode 13 is large (for example, the control voltage $V_1$=−180 kV), an axial electric potential (see FIG. 4) monotonically increases ($\partial V/\partial Z > 0$), and an axial electric field (see FIG. 5) has extreme values ($\partial Ez/\partial Z = 0$) at two locations on the optical axis, and has a local minimum value and a local maximum value. An intensity of a convex lens distributed in a region of $\partial^2 V/\partial Z^2 > 0$ between the first anode electrode 22 and the second anode electrode 23 is proportional to $|\partial^2 V/\partial Z^2|$. It can be seen that when compared with a case in which the anode electrode does not have a curvature, that is, both the anode electrode and the cathode electrode are implemented by flat plate electrodes, adopting the Pierce type electrode structure increases $|\partial^2 V/\partial Z^2|$ and enhances the convex lens effect.

For a pulsed electron beam having a pulse width ($\tau_p$) of four picoseconds which can be achieved by the photocathode 13 having the NEA surface and using GaAs as the photoelectric film 12 (active layer), a virtual light source position $z_{vs}$ is shown in FIG. 6, a virtual light source radius $r_{vs}$ is shown in FIG. 7, an irradiation aperture angle $\alpha_{vs}$ of the electron beam is shown in FIG. 8, a converted brightness $\beta$ is shown in FIG. 9, and emittance is shown in FIG. 10. The virtual light source position $z_{vs}$, the virtual light source radius $r_{vs}$, the irradiation aperture angle $\alpha_{vs}$, the converted brightness $\beta$, and the emittance are calculated by setting the condensed light diameter of the pulsed excitation light 2 to the photoelectric film 12 to φ1 μm and changing values of the control voltage $V_1$ and the number $N_e$ of electrons in one pulse. Also, in each of FIGS. 6 to 10, waveforms when the control voltage $V_1$=−195 kV, −190 kV, and −180 kV are indicated by a broken line, a dotted line, and a solid line, respectively.

Definitions of the virtual light source position $z_{vs}$, the virtual light source radius $r_{vs}$, and the irradiation aperture angle $\alpha_{vs}$ will be described with reference to FIG. 11. For the pulsed electron beam 25 that has passed through a diaphragm 51, when a trajectory in a region without a lens field after passing through the second anode electrode 23 is extrapolated to a photocathode 13 side, a position 15 at which spread in a horizontal direction is minimum is the virtual light source position $z_{vs}$, a beam radius at the position is defined as the virtual light source radius $r_{vs}$, and an aperture half angle of the electron beam from a virtual light source is defined as the irradiation aperture angle $\alpha_{vs}$. Assuming that an elementary charge is e=−1.6×10$^{-19}$ C and the acceleration voltage $V_0$=−200 kV, the converted brightness $\beta$ can be calculated by a relational expression shown in Equation 1. The emittance is defined by $r_{vs} \times \alpha_{vs}$.

[Math 1]

$$\beta = \frac{eN_e}{\tau_p (\pi^2 r_{vs}^2 \alpha_{vs}^2 V_0)} \quad \text{(Math 1)}$$

When the converted brightness $\beta$ increases in proportion to the number $N_e$ of electrons per pulse, it can be said that the space charge effect is not obvious under the condition. As shown in FIG. 9, under a condition of the control voltage $V_1$=−180 kV, a substantial linearity is maintained within an entire calculated range, whereas under conditions of the control voltage $V_1$=−190 kV and −195 kV, the converted brightness $\beta$ is saturated as the number $N_e$ of electrons per pulse increases. When the number $N_e$ of electrons per pulse is the same, the converted brightness β increases as the surface electric field intensity increases. For example, it is found that when the converted brightness β is compared under a condition of the number $N_e$ of electrons included in one pulse is $10^4$, the converted brightness β is $4.0\times10^7$ $A/m^2/sr/V$, which is about twice that of the Schottky-type field emission electron gun, in the electron gun in the related art (FIG. 3, corresponding to the condition of the control voltage $V_1$=−195 kV), whereas the converted brightness β is up to $1.2\times10^8$ $A/m^2/sr/V$, which is approaching that of a cold field emission (CFE) electron gun, under the condition of the control voltage $V_1$=−180 kV. As shown in FIG. 10, the emittance is an index indicating that a beam convergence is better as a value of the emittance is smaller, and it can be confirmed that the larger the surface electric field intensity, the smaller the spread in the lateral direction of the pulsed electron beam having a larger number $N_e$ of electrons per pulse.

Based on the above calculation results, it can be seen that an acceleration electric field intensity on a cathode surface is preferably as large as possible in order to prevent the influence of the space charge effect in the electron gun configuration according to the present embodiment as shown in FIGS. 9 and 10. Specifically, the electric field intensity on the surface of the photocathode 13 is preferably 5 MV/m or more in order to reduce the adverse effect of the space charge effect when the number of electrons per pulse is increased in the pulsed electron beam.

A reason why such a calculation result is obtained can be described as follows. Divergence of an electron trajectory caused by repulsion of electrons in the vicinity of the surface of the photocathode 13 corresponds to a situation in which a concave lens is present on the surface of the photocathode 13. Meanwhile, by applying the control voltage $V_1$ to the first anode electrode 22 to provide the acceleration electric field, it is possible to obtain the same effect as an effect obtained when a convex lens is formed on the surface of the photocathode 13 to cancel the concave lens effect caused by the space charge effect. According to this principle, it can be described that the influence of the space charge effect on the surface of the photocathode 13 is prevented by the control voltage $V_1$ applied to the first anode electrode 22. Therefore, in order to obtain a high brightness even for a pulsed electron beam that has a large number of electrons per pulse and is likely to strongly express the influence of the space charge effect, it is effective to control the control voltage $V_1$ of the first anode electrode 22 such that the acceleration electric field on the surface of the photocathode 13 is maximized.

However, in practice, when a large potential difference is formed in a narrow space between the cathode electrode 14 and the first anode electrode 22, a discharge risk increases. For this reason, in the arrangement of the cathode electrode 14, the first anode electrode 22, and the second anode electrode 23, it is necessary to calculate in advance an electric field intensity distribution assumed based on a voltage value actually applied and to implement an electrode structure having a low discharge risk. The virtual light source radius $r_{vs}$, the virtual light source position $z_{vs}$, the irradiation aperture angle $\alpha_{vs}$, and the converted brightness β depend on the acceleration voltage, the pulse width, the number of electrons, and the like of the pulsed electron beam. For this reason, it is possible to consider a configuration of an electron microscope in which the above parameters are calculated in advance by simulation and an irradiation condition of the electron optical system from the pulsed electron gun to the sample is optimized so as to match the conditions. The configuration of such an electron microscope will be described in the following Embodiments 2 to 4.

In order to prevent the influence of the space charge effect, an excitation optical system may be implemented such that a condensing position of the pulsed excitation light 2 is defocused from the active layer (photoelectric film 12) of the photocathode 13, and a condition of a slightly large condensed light diameter can be selected. Since the space charge effect is obvious when electrons repel each other in the vicinity of an electron emission position, the influence of the space charge effect is reduced by increasing an electron emission area. The excitation optical system may be implemented such that the condensed light diameter can be used continuously or by switching between a specific defocus condition and a focus condition. The pulsed electron gun may be implemented to set a defocus amount within a range in which the brightness does not significantly decrease. However, under the condition in which the excitation light is defocused, the virtual light source radius $r_{vs}$ of the pulsed electron gun increases, and the number $N_e$ of electrons emitted per pulse also changes. Therefore, it is necessary to separately set an optimal convergence condition of the electron optical system for the defocus condition.

As described above, the pulsed electron gun to which the photocathode having the NEA surface and the high brightness is applied has been described, but the electrode structure shown in FIG. 1 or 2 is also effective as a method of preventing the influence of the space charge effect for a planar pulsed electron gun having the same degree of the brightness as that using the NEA photocathode.

An electron beam application device mounted with the pulsed electron gun according to Embodiment 1 will be described below.

Embodiment 2

A configuration example of a transmission electron microscope (TEM) mounted with the pulsed electron gun according to Embodiment 1 is shown in FIGS. 12 and 13. FIG. 12 shows a case in which the pulsed electron beam 25 has no crossover between the photocathode 13 and a sample 52. FIG. 13 shows a case in which the pulsed electron beam 25 has a crossover 26 between the photocathode 13 and the sample 52. Under a condition under which the space charge effect at a crossover position is not a problem, such as a condition in which the acceleration voltage of the pulsed electron beam 25 is large or a condition in which the number of electrons in one pulse is small, the deterioration of spatial resolution does not become a problem even when the electron optical system is controlled to have the crossover. Meanwhile, under a condition under which the space charge effect at the crossover position is likely to be a problem, such as a condition in which the acceleration voltage of the pulsed electron beam is small or a condition in which the number of electrons in one pulse is large, it is preferable to control the electron optical system to have no crossover as shown in FIG. 12 or to minimize the number of the crossovers in order to avoid the deterioration of the spatial resolution.

In the TEM, the sample 52 is irradiated with the electron beam, and an image or a diffraction pattern obtained by projecting transmitted electrons 27 onto a fluorescent surface 53 by an object lens 62, a projection lens, or the like is captured by a CCD camera or the like. For a purpose of measuring an energy spectrum of the electron beam transmitted through the sample 52, an electron energy loss spectroscopy (EELS) detector may be disposed. By controlling a timing at which an irradiation electron beam is short-pulsed and is emitted, a single shot image of the TEM can be acquired, and a fast phenomenon occurring in a time scale equivalent to a pulse width can be imaged.

Under the condition in which the number of electrons per pulse is large, the virtual light source radius $r_{vs}$ increases due to the space electron effect. Therefore, a control system of a pulsed electron microscope is implemented such that the acceleration voltage, the number of electrons, the pulse width, and the like set for the pulsed electron beam are set to an optimum control value for the setting condition based on the virtual light source radius $r_{vs}$ calculated in advance.

In order to obtain high spatial resolution in a TEM observation, it is necessary to set an irradiation angle (half angle) θ of the pulsed electron beam 25 to be small such that a condition is achieved in which the sample 52 is irradiated with the pulsed electron beam 25 close to be parallel. The irradiation angle θ of the pulsed electron beam 25 is adjusted by an intensity of a condenser lens 61 mounted between the photocathode 13 and the sample 52 and by the diaphragm 51 that limits a passing region of the electron beam. As shown in FIG. 14, the irradiation angle (half angle) θ of the electron beam 25 is defined as an angle at which a crossover 17 formed closer to the photocathode 13 than the sample 52 is viewed. The irradiation angle θ is expressed by $\theta = M r_{vs}/L$, in which $r_{vs}$ represents the virtual light source radius of the pulsed electron gun, M represents a reduction ratio of the condenser lens, and L represents a distance between the crossover 17 and the sample 52. The reduction ratio M also depends on the virtual light source position $z_{vs}$ of the pulsed electron gun.

Meanwhile, a radius R of an electron beam irradiation region of the pulsed electron beam 25 passing through the diaphragm 51 can be approximated to the radius $R \sim L\alpha_{vs}/m$, in which $\alpha_{vs}$ represents an irradiation aperture angle of a virtual light source position 16. It is necessary to set a current density (varies as $R^{-2}$) to be large in order to improve an image S/N. Here, a product of the radius R and the irradiation half angle θ can be approximated as shown in (Equation 2). Based on (Equation 2), a pulsed electron gun having a large converted brightness β is preferable in order to reduce the irradiation angle θ and increase the current density.

[Math 2]

$$R \times \theta \sim \alpha_{vs} r_{vs} = \sqrt[4]{eN_e/(\tau_p \pi^2 \beta V_0)} \propto \beta^{-1/2} \quad \text{(Math 2)}$$

FIG. 20 shows an example of a procedure for setting control parameters of the electron microscope. First, the pulse width, the pulse interval, and a charge amount (number of electrons) are set as irradiation conditions of the pulsed electron beam 25 emitted from the photocathode 13 (S1). Each of these parameters can be freely set by an observer within a range of corresponding one of setting values given as device specifications. The pulse width and the pulse interval of the pulsed electron beam 25 are determined according to the pulse width and the pulse interval of the pulsed excitation light 2 with which the photocathode 13 is substantially irradiated. The charge amount per pulse is determined according to the pulse width and a peak intensity (or a peak energy obtained by integrating the intensity over time) of the pulsed excitation light 2 in addition to a condensing condition of the excitation light. Therefore, the irradiation conditions of the pulsed electron beam 25 can be set by setting irradiation conditions of the pulsed excitation light 2 to the photocathode 13.

Subsequently, the electrode voltages of the pulsed electron gun 21, that is, the acceleration voltage $V_0$ and the control voltage $V_1$ are set (S2). In a normal observation, it is preferable to use the pulsed electron gun 21 under a high brightness condition, and thus the maximum value of the settable control voltage $V_1$ is set such that the electric field intensity on the surface of the photocathode is maximum.

When the above pulse conditions are determined, the virtual light source position $z_{vs}$, the virtual light source radius $r_{vs}$, the irradiation aperture angle $\alpha_{vs}$, and the converted brightness β of the pulsed electron gun 21 are determined. The device stores in advance, as internal parameters, calculated values obtained by performing a simulation with a plurality of pulse conditions for these parameters. The control unit 41 obtains, with reference to the internal parameters, values of the parameters of the pulsed electron gun under the set pulse conditions (S3). Subsequently, the control unit 41 sets, according to the parameters of the electron gun corresponding to the pulse conditions, the irradiation conditions of the electron optical system to obtain an appropriate crossover position for each of the electron lenses provided between the pulsed electron gun 21 and the sample 52 (S4). The irradiation angle θ and an irradiation area (radius R) of the pulsed electron beam with which the sample is irradiated are adjusted by controlling the distance L between the sample 52 and the crossover and a magnification M of the electron optical system. A desired observation field is specified (S5). An observation condition is determined, and image data and spectrum data are acquired (S6).

In the flow of FIG. 20, the irradiation angle θ and the irradiation region (radius R) are changed by controlling the irradiation conditions of the electron optical system, whereas the irradiation angle θ and the irradiation region (radius R) may be changed by controlling the control voltage $V_1$ of the first anode electrode 22 with conditions such as convergence conditions of the condenser lens 61 and the object lens 62 and an alignment condition of the electron beam being fixed. For example, in the case of the electrode structure shown in FIG. 1, for the pulse condition with the number of electrons being $10^4$, when the control voltage $V_1$ is changed from −180 kV to −195 kV, the virtual light source position $z_{vs}$ is changed from −18 mm to −60 mm, the virtual light source radius $r_{vs}$ is changed from 0.8 μm to 2.0 μm, and the irradiation aperture angle $\alpha_{vs}$ is changed from 1.5 mrad to 1.2 mrad. Even when the parameters of the electron optical system are fixed, the irradiation angle θ and the irradiation region (radius R) on the sample 52 are changed by changing the control voltage $V_1$, and thus the observer can select a preferable observation condition. An example of a procedure for setting the control parameters in this case is shown in FIG. 21. Basically, the observation condition is determined according to the same procedure as in FIG. 20. In a normal TEM observation, the irradiation conditions of the electron beam to the sample is controlled according to a crossover position formed by the condenser lens 61 disposed between the electron gun 21 and the sample 52, but in the electron microscope according to the present embodiment, the same control can be performed by changing the control voltage $V_1$ of the electron gun 21 when the conditions of the electron optical system are fixed (S7).

When the pulsed electron gun 21 according to the present embodiment is used under the condition of the maximum brightness regardless of the pulse conditions, it is preferable to use the pulsed electron gun 21 under the condition that the surface electric field of the photocathode 13 is maximum. In order to obtain the higher spatial resolution, an aberration corrector for spherical aberration and chromatic aberration may be mounted in an imaging system.

Embodiment 3

A configuration example of a scanning transmission electron microscope (STEM) or a scanning electron microscope (SEM) mounted with the pulsed electron gun according to Embodiment 1 is shown in FIGS. 15 and 16. FIG. 15 shows a case in which the pulsed electron beam 25 has no crossover between the photocathode 13 and the sample 52. FIG. 16 shows a case in which the pulsed electron beam has the crossover 26 between the photocathode 13 and the sample 52. Under the condition under which the space charge effect at the crossover position is not a problem, such as the condition in which the acceleration voltage of the pulsed electron beam 25 is large or the condition in which the number of electrons in one pulse is small, the deterioration of the spatial resolution does not become a problem even when the electron optical system is controlled to have the crossover. Meanwhile, under the condition under which the space charge effect at the crossover position is likely to be a problem, such as the condition in which the acceleration voltage of the pulsed electron beam is small or the condition in which the number of electrons in one pulse is large, it is preferable to control the electron optical system to have no crossover as shown in FIG. 15 or to minimize the number of the crossovers in order to avoid the deterioration of the spatial resolution.

In the STEM or the SEM, when the sample 52 is scanned, by a deflector 63, with the irradiation electron beam 25 converged by several stages of the condenser lens 61 and the object lens 62, signal electrons (the transmitted electrons 27, secondary electrons 28, and the like) generated at each irradiation position are detected by a detector 54 and a detector 55, and a mapping image of a signal intensity is obtained as an observation image. By using an off-axis deflector 64 implemented by, for example, a Wien filter in order to detect the secondary electrons 28, it is possible to efficiently detect the secondary electrons 28 having low energy (<approximately 20 eV) by using the detector 55. A bright field detector, a dark field detector, an EELS detector, a cathode luminescence (CL) detector, and the like may be mounted as the detector 54 for the electrons 27 transmitted through the sample 52. A time resolved measurement for a reversible process, which is performed by a pump-probe method, may be possible by connecting, to the pulsed light source 1, the pulse generator, the delay controller, and the like that perform the synchronization control with the excitation light source for the sample.

FIG. 17 is a diagram schematically showing dependence of each factor for determining an axial beam diameter on an irradiation angle $\alpha_i$ under a condition in which a probe current is constant. In the STEM or the SEM, an irradiation beam diameter 75 of the pulsed electron beam 25 converged on the sample depends on geometric aberration (spherical aberration $\delta_S$ 71, chromatic aberration $\delta_C$ 72, diffraction aberration $\delta_D$ 73) of the object lens 62 and a light source radius $\delta_O$ 74. Each factor has the dependency on the irradiation angle $\alpha_i$ (see FIGS. 15 and 16) to the sample, and an optimum value ($\alpha_{opt}$) of the irradiation angle $\alpha_i$ at which the beam diameter is minimum exists. The irradiation angle $\alpha_i$ of the electron beam 25 on the sample is adjusted by a convergence intensity of the condenser lens 61 and the object lens 62 that are mounted between the photocathode 13 and the sample 52 and by the diaphragm 51 that limits the passing region of the pulsed electron beam 25.

Under the condition in which the number $N_e$ of electrons per pulse is large, the virtual light source radius $r_{vs}$ increases due to the space charge effect. For this reason, it is necessary to appropriately control the electron optical system in order to ensure the required spatial resolution. The light source radius $\delta_O$ is calculated based on (Equation 3) from the converted brightness $\beta$ of the pulsed electron gun, and the larger the converted brightness $\beta$ of the pulsed electron gun, the smaller the light source radius $\delta_O$. Therefore, it can be seen that when the number $N_e$ of electrons per pulse is the same, contribution of the light source radius $\delta_O$ to the irradiation beam diameter 75 can be reduced as the converted brightness $\beta$ becomes larger.

[Math 3]

$$\delta_O = \sqrt{eN_e/(\tau_p \pi^2 \alpha_i^2 \beta V_0)} \propto \beta^{-1/2} \quad \text{(Math 3)}$$

The optimum value ($\alpha_{opt}$) of the irradiation half angle $\alpha_i$ is determined based on numerical values of the spherical aberration $\delta_S$ 71, the chromatic aberration $\delta_C$ 72, the diffraction aberration $\delta_D$ 73, and the light source radius $\delta_O$ 74 assumed from the setting conditions of the observer. The control unit 41 sets the irradiation conditions of the electron optical system under which the optimum irradiation angle $\alpha_{opt}$ is provided. The procedure for setting the control parameters of the electron microscope at this time is the same as that in FIG. 20 described in Embodiment 2, and redundant description will be omitted.

When the pulse conditions of the pulsed electron beam are set in steps S1 and S2, the virtual light source position $z_{vs}$, the virtual light source radius $r_{vs}$, the irradiation aperture angle $\alpha_{vs}$, and the converted brightness $\beta$ of the pulsed electron gun 21 are determined. The device stores in advance, as the internal parameters, the calculated values obtained by performing the simulation with a plurality of pulse conditions for these parameters. In the case of the SEM or the STEM, the light source radius $\delta_O$ projected onto the sample as described above depends on the brightness $\beta$, and both the light source radius $\delta_O$ and the diffraction aberration $\delta_D$ are inversely proportional to the irradiation angle $\alpha_i$ on the sample. Therefore, under a condition in which the charge amount $N_e$ included in one pulse is sufficiently small and the light source radius $\delta_O$ projected onto the sample is sufficiently small, the optimum irradiation angle $\alpha_{opt}$ is determined based on the diffraction aberration $\delta_D$, the spherical aberration $\delta_S$, and the chromatic aberration $\delta_C$. Meanwhile, under a condition in which the charge amount $N_e$ included in one pulse is large and the light source radius $\delta_O$ projected onto the sample is sufficiently large, the contribution of the light source radius $\delta_O$ to the beam diameter is larger than contribution of the diffraction aberration $\delta_D$ to the beam diameter. Therefore, the optimum irradiation angle $\alpha_{opt}$ is determined based on the light source radius $\delta_O$, the spherical aberration as, and the chromatic aberration $\delta_C$. The optimum irradiation angle $\alpha_{opt}$ is determined by plotting contribution of each aberration to the beam diameter with respect to the irradiation angle $\alpha_i$ for each of the conditions as shown in FIG. 17 and obtaining a minimum calculated value of the total beam diameter.

The control unit 41 sets, according to the parameters of the electron gun corresponding to the pulse conditions, the irradiation conditions of the electron optical system to obtain an appropriate crossover position by which the optimum irradiation angle $\alpha_{opt}$ is provided for each of the electron lenses provided between the pulsed electron gun 21 and the sample 52 (S4).

As in Example 2, the control voltage $V_1$ applied to the first anode electrode 22 may be changed in order to adjust the irradiation angle $\alpha_i$ on the sample. The procedure for setting the control parameters in this case is the same as that in the flow in FIG. 21. In a normal SEM observation or a normal STEM observation, the irradiation conditions of the electron beam to the sample is controlled according to a crossover position formed by the condenser lens 61 disposed between the electron gun 21 and the sample 52, but in the electron microscope according to the present embodiment, the same control can be performed by changing the control voltage $V_1$ of the electron gun 21 with the conditions of the electron optical system being fixed (S7).

In order to obtain a higher spatial resolution, an SEM or an STEM may be used in which an aberration corrector for correcting the spherical aberration and the chromatic aberration is mounted between the photocathode 13 and the sample 52.

Embodiment 4

FIG. 18 shows a configuration example of an SEM mounted with the pulsed electron gun according to Embodiment 1. In general, in an SEM that is used at the acceleration voltage of 30 kV or less, an energy of an electron beam used is smaller than that of the transmission type TEM or the STEM, and thus the influence caused by the space charge effect is more likely to become obvious. It is necessary to decelerate the electron beam between the electron gun 21 and the sample when an absolute value of the electrode voltage $V_0$ applied to the cathode electrode 14 is small and a large positive voltage is applied to the second anode electrode 23 in order to greatly accelerate the electron beam emitted from the photocathode 13. For this reason, it is not preferable to increase the crossover in the trajectory of the electron beam in the electron optical system. Meanwhile, when a space from the second anode electrode 23 to the sample is set to a reference potential (ground potential), it is difficult to set a large potential difference between the cathode electrode 14 and the first anode electrode 22, and it is difficult to sufficiently reduce the influence of the space charge effect. Therefore, a deceleration method is applied in the electron optical system of the electron beam application device according to Embodiment 4.

A retarding method of applying a negative voltage to a sample 57 is applied in the configuration example of the SEM in FIG. 18. For example, when −10 kV is applied as a retarding voltage to the sample 57, the pulsed electron gun 21 can achieve an irradiation voltage of 1 kV on the sample 57 by using the pulsed electron beam 25 emitted under an emission condition of the acceleration voltage of 11 kV. In this case, it is possible to set the voltage $V_0$ applied to the cathode electrode 14 to −11 kV, the voltage $V_1$ applied to the first anode electrode 22 to −1 kV, and the voltage $V_2$ applied to the second anode electrode 23 to 0 V. The acceleration electric field intensity of 5 MV/m or more on the surface of the photocathode 13 can be achieved. When the voltage conditions are set as described above, an energy of the pulsed electron beam 25 after passing through the second anode electrode 23 and reaching the sample 57 is accelerated to 11 keV. Therefore, the repulsion between the electrons in the pulse is prevented, and the space charge effect is expected to be reduced.

When the negative voltage is applied to the sample 57, the secondary electrons 28 generated on the sample 57 is accelerated by an electric field distributed between the object lens 62 and the sample 57, passes through a lens magnetic field region of the object lens 62, and travels in a direction of the photocathode 13. Therefore, a donut-shaped conversion electrode 56 is provided in an SEM column, and a signal having a sufficient intensity can be detected by detecting, by the detector 55, low energy electrons 29 generated by the secondary electrons 28 colliding with the conversion electrode 56.

In a configuration example of an SEM in FIG. 19, a boosting method in which the same potential distribution is provided on the optical axis as the ground potential is applied to the sample 52. In the boosting method, the second anode electrode 23 is extended to the vicinity of the sample 52 to form the accelerating tube, and a high voltage is applied to the second anode electrode 23 forming the accelerating tube. The pulsed electron beam 25 emitted from the photocathode 13 is transported inside the tubular second anode electrode 23 in a state in which a high energy is maintained. For example, it is expected that the same effect as that of the SEM in FIG. 18 can be obtained when the voltage $V_0$ applied to the cathode electrode 14 is set to −1 kV, the voltage $V_1$ applied to the first anode electrode 22 is set to +9 kV, and the voltage $V_0$ applied to the second anode electrode 23 is set to +10 kV.

REFERENCE SIGNS LIST

1: pulsed light source
2: pulsed excitation light
3: viewing port
4: condenser lens
11: transparent substrate
12: photoelectric film
13: photocathode
14: cathode electrode
21: pulsed electron gun
22: first anode electrode
23: second anode electrode
24: third anode electrode
25: pulsed electron beam
26: crossover
27: transmitted electron
28: secondary electron
29: electron
30 to 33: power supply
41: control unit
51: diaphragm
52, 57: sample
53: fluorescent surface
54, 55: detector
56: conversion electrode
58: guard electrode
59: annular detector
61: condenser lens
62: object lens
63: deflector
64: off-axis deflector
71: spherical aberration
72: chromatic aberration
73: diffraction aberration
74: light source radius
75: irradiation beam diameter
114: cathode electrode
121: pulsed electron gun
123: anode electrode
130: power supply

The invention claimed is:

1. An electron gun, comprising:
   a photocathode including a substrate and a photoelectric film formed on the substrate;
   a light source configured to emit a pulsed excitation light;
   a condenser lens facing the substrate of the photocathode and configured to condense the pulsed excitation light toward the photocathode;
   a first anode electrode and a second anode electrode facing the photoelectric film of the photocathode;
   a first power supply configured to apply a first control voltage between the first anode electrode and the second anode electrode; and
   a second power supply configured to apply an acceleration voltage between the photocathode and the second anode electrode, wherein
   the first anode electrode is disposed between the photocathode and the second anode electrode,
   a surface of the first anode electrode facing the second anode electrode has a recessed shape, and a surface of the second anode electrode facing the first anode electrode has a protruding shape, and
   the first control voltage is set such that the photocathode has a surface electric field intensity higher than a surface electric field intensity when the acceleration voltage is applied to the second anode electrode in the absence of the first anode electrode.

2. The electron gun according to claim 1, wherein
   when the acceleration voltage is applied between the photocathode and the second anode electrode, and the first control voltage is applied between the first anode electrode and the second anode electrode, the surface electric field intensity of the photocathode is 5 MV/m or more.

3. The electron gun according to claim 1, wherein
   when the acceleration voltage is applied between the photocathode and the second anode electrode, and the first control voltage is applied between the first anode electrode and the second anode electrode, an axial potential distribution between the photocathode and the second anode electrode does not have an extreme value, and an axial electric field intensity between the photocathode and the second anode electrode has a local maximum value and a local minimum value.

4. The electron gun according to claim 1, further comprising:
   a third anode electrode disposed between the first anode electrode and the second anode electrode; and
   a third power supply configured to apply a second control voltage between the third anode electrode and the second anode electrode, wherein
   the surface of the first anode electrode facing the third anode electrode has a recessed shape, and a surface of the third anode electrode facing the first anode electrode has a protruding shape, and
   a surface of the third anode electrode facing the second anode electrode has a recessed shape, and the surface of the second anode electrode facing the third anode electrode has a protruding shape.

5. The electron gun according to claim 1, wherein
   the photoelectric film is a semiconductor whose surface has a negative electron affinity.

6. The electron gun according to claim 1, wherein
   the first anode electrode or the second anode electrode includes partial electrodes obtained by equally dividing the first anode electrode or the second anode electrode in an azimuthal direction, and the partial electrodes are disposed symmetrically about an optical axis.

7. An electron beam application device, comprising:
   an electron optical system including an electron gun and configured to irradiate a sample with a pulsed electron beam emitted from the electron gun;
   a detector configured to detect, by irradiating the sample with the pulsed electron beam, electrons transmitted through the sample or electrons emitted by interaction with the sample; and
   a control unit configured to control an irradiation condition of the pulsed electron beam emitted from the electron optical system to the sample, wherein
   the electron gun includes:
      a photocathode including a substrate and a photoelectric film formed on the substrate;
      a light source configured to emit a pulsed excitation light;
      a condenser lens facing the substrate of the photocathode and configured to condense the pulsed excitation light toward the photocathode; and
      a first anode electrode and a second anode electrode disposed facing the photoelectric film of the photocathode,
   the first anode electrode is disposed between the photocathode and the second anode electrode, a surface of the first anode electrode facing the second anode electrode has a recessed shape, and a surface of the second anode electrode facing the first anode electrode has a protruding shape, and
   the control unit optimizes the irradiation condition of the pulsed electron beam emitted from the electron optical system to the sample according to a parameter of the electron gun under a predetermined pulse condition set for the electron gun.

8. The electron beam application device according to claim 7, wherein
   the parameter of the electron gun includes a virtual light source position, a virtual light source radius, an irradiation aperture angle, and a converted brightness value.

9. The electron beam application device according to claim 7, wherein
   the control unit stores in advance, as an internal parameter, a parameter of the electron gun obtained by performing a simulation with a plurality of pulse conditions set for the electron gun, and obtains, with reference to the internal parameter, the parameter of the electron gun under the predetermined pulse condition set for the electron gun.

10. The electron beam application device according to claim 7, wherein
    the control unit controls a control voltage applied between the first anode electrode and the second anode electrode of the electron gun in order to control an irradiation angle of the pulsed electron beam with respect to the sample.

11. The electron beam application device according to claim 7, wherein
    the electron beam application device is a scanning electron microscope, and
    the electron optical system is an electron optical system to which a deceleration method is applied.

12. The electron beam application device according to claim 11, wherein
an end portion of the second anode electrode of the electron gun is extended to the vicinity of the sample to form an accelerating tube.

13. The electron beam application device according to claim 7, wherein
when an acceleration voltage is applied between the photocathode and the second anode electrode, and a control voltage is applied between the first anode electrode and the second anode electrode, the photocathode has a surface electric field intensity higher than a surface electric field intensity of the photocathode when the acceleration voltage is applied to the second anode electrode in the absence of the first anode electrode.

14. The electron beam application device according to claim 7, wherein
when an acceleration voltage is applied between the photocathode and the second anode electrode, and a control voltage is applied between the first anode electrode and the second anode electrode, a surface electric field intensity of the photocathode is 5 MV/m or more.

* * * * *